United States Patent
Zhang et al.

(10) Patent No.: US 10,628,049 B2
(45) Date of Patent: Apr. 21, 2020

(54) SYSTEMS AND METHODS FOR ON-DIE CONTROL OF MEMORY COMMAND, TIMING, AND/OR CONTROL SIGNALS

(71) Applicant: SanDisk Technologies LLC, Plano, TX (US)

(72) Inventors: Yuheng Zhang, Saratoga, CA (US); Gordon Yee, San Mateo, CA (US); Yibo Yin, San Mateo, CA (US); Tz-Yi Liu Liu, Palo Alto, CA (US)

(73) Assignee: Sandisk Technologies LLC, Plano, TX (US)

( * ) Notice: Subject to any disclaimer, the term of this patent is extended or adjusted under 35 U.S.C. 154(b) by 35 days.

(21) Appl. No.: 15/870,390

(22) Filed: Jan. 12, 2018

(65) Prior Publication Data

US 2019/0018597 A1  Jan. 17, 2019

Related U.S. Application Data

(60) Provisional application No. 62/531,832, filed on Jul. 12, 2017.

(51) Int. Cl.
*G06F 3/06* (2006.01)
*G11C 7/22* (2006.01)
(Continued)

(52) U.S. Cl.
CPC ............ *G06F 3/0611* (2013.01); *G06F 3/065* (2013.01); *G06F 3/0629* (2013.01);
(Continued)

(58) Field of Classification Search
CPC .................................................. G06F 13/1668
(Continued)

(56) References Cited

U.S. PATENT DOCUMENTS

| 4,673,930 A | 6/1987 | Bujalski et al. |
| 5,099,446 A * | 3/1992 | Sako ........................ G06F 5/065 |
| | | 708/495 |

(Continued)

FOREIGN PATENT DOCUMENTS

CN  202662294  1/2013

OTHER PUBLICATIONS

Choi, et al., NAND Flash Memory, Samsung Electronics, Co., Ltd, Flash Design Team, May 7, 2010.
(Continued)

*Primary Examiner* — Min Huang
(74) *Attorney, Agent, or Firm* — Stoel Rives LLP

(57) ABSTRACT

A sequencer circuit is configured to generate control signals for on-die memory control circuitry. The control signals may include memory operation pulses for implementing operations on selected non-volatile memory cells embodied within the same die as the sequencer (and other on-die memory control circuitry). The timing, configuration, and/or duration of the memory control signals are defined in configuration data, which can be modified after the design and/or fabrication of the die and/or on-die memory circuitry. As such, the timing, configuration, and/or duration of the memory control signals generated by the sequencer may be manipulated after the design and/or fabrication of the die, sequencer, and other on-die memory control circuitry.

23 Claims, 8 Drawing Sheets

(51) Int. Cl.
- *G11C 29/02* (2006.01)
- *G11C 11/00* (2006.01)
- *G11C 29/50* (2006.01)
- *G11C 16/32* (2006.01)
- *G06F 12/02* (2006.01)
- *G11C 16/04* (2006.01)

(52) U.S. Cl.
CPC .......... *G06F 3/0659* (2013.01); *G06F 3/0688* (2013.01); *G06F 12/0246* (2013.01); *G11C 7/22* (2013.01); *G11C 11/005* (2013.01); *G11C 16/32* (2013.01); *G11C 29/023* (2013.01); *G11C 29/028* (2013.01); *G11C 29/50012* (2013.01); *G11C 16/0483* (2013.01)

(58) Field of Classification Search
USPC ........................................................ 711/167
See application file for complete search history.

(56) References Cited

U.S. PATENT DOCUMENTS

| | | | |
|---|---|---|---|
| 5,394,541 A | 2/1995 | Chelsey et al. | |
| 6,092,164 A | 7/2000 | Konishi et al. | |
| 6,775,718 B2 * | 8/2004 | Saruwatari | G06F 13/28 710/20 |
| 7,010,736 B1 * | 3/2006 | Teh | G11C 29/12005 365/185.22 |
| 7,020,815 B2 | 3/2006 | Jeddeloh | |
| 7,110,298 B2 | 9/2006 | Moogat et al. | |
| 7,327,619 B2 | 2/2008 | Chan et al. | |
| 7,356,656 B1 | 4/2008 | Chang | |
| 7,652,502 B2 | 1/2010 | Norman | |
| 7,941,587 B2 | 5/2011 | Brahmadathan et al. | |
| 8,514,621 B2 | 8/2013 | Choi et al. | |
| 9,081,666 B2 | 7/2015 | Brewer et al. | |
| 9,299,443 B1 | 3/2016 | Dong et al. | |
| 9,431,119 B2 | 8/2016 | Hyun et al. | |
| 9,633,742 B2 | 4/2017 | Desai et al. | |
| 9,721,671 B2 | 8/2017 | Chu et al. | |
| 2002/0174382 A1 | 11/2002 | Ledford et al. | |
| 2004/0268030 A1 * | 12/2004 | Cheung | H04N 5/33 711/105 |
| 2009/0300278 A1 | 12/2009 | Kruger | |
| 2010/0082881 A1 | 4/2010 | Klein | |
| 2016/0179388 A1 | 6/2016 | Huang et al. | |
| 2016/0202914 A1 * | 7/2016 | Hsu | G06F 3/0604 714/49 |
| 2017/0060450 A1 | 3/2017 | Roberts | |

OTHER PUBLICATIONS

Neale, et al.,Digital Timing Control in SRAMs for Yield Enhancement and Graceful Aging Degradation, A Thesis presented to the University of Waterloo for the degree of Master of Applied Science in Electrical and Computer Engineering, Waterloo, Ontario, Canada, 2010.

Rabaey, et al.,Lecture 24: Peripheral Memory Circuits, CMPEN 411, VLSI Digital Circuits, Spring 2011 (Adapted from Rabaey's Digital Integrated Circuits, Second Edition, 2003).

* cited by examiner

SYSTEMS AND METHODS FOR ON-DIE CONTROL OF MEMORY COMMAND, TIMING, AND/OR CONTROL SIGNALS

RELATED APPLICATIONS

This application claims the benefit of the earliest available effective filing date of U.S. Provisional Application No. 62/531,832, which was filed on Jul. 12, 2017, and is hereby incorporated by reference herein.

TECHNICAL FIELD

The present disclosure, in various embodiments, relates to memory operation pulse control and more particularly relates to using a volatile memory to control memory operation pulse timing.

BACKGROUND

A non-volatile (NV) memory system may comprise a sequencer, which may be configured to, inter alia, implement operations on the NV memory. In response to a request to execute a particular operation, the sequencer may generate memory control signals, such as command signals, timing signals, control signals, operation signals, operation pulses, and/or the like. The signals generated by the sequencer may be adapted to configure the memory device to implement the particular operation. The configuration, timing, and/or duration of the signals may determine the configuration and/or timings of the corresponding memory operations performed within the NV memory. Conventional sequencers may produce control signals in a determined sequence and/or timing by use of logic circuitry, which may be embodied on the same structures as the memory (the same die as the memory elements controlled by the sequencer). The logic circuitry may be implemented within a peripheral region of the memory die. Accordingly, the sequencer may be designed to have a low size and/or power footprint. The configuration, timing, and/or duration of the signals produced by conventional on-die control circuitry may be fixed when the memory is designed and/or fabricated (e.g., may be "hard wired" into the design of the circuitry). As such, the configuration, timing, and/or duration of the control signals produced by conventional on-die control circuitry may not be capable of being changed after design and/or fabrication. If changes are desired, due to errors, bugs, or other considerations, the on-die control circuitry may have to be re-designed or re-fabricated, which can be expensive and time consuming (and may impact other components embodied on the die). However, it may be advantageous to modify the configuration, timing, and/or duration of certain control signals (or control signal sequences or patterns) after design and/or fabrication. Such modifications may enable the memory device to adapt to different usage conditions, wear levels, testing conditions, performance evaluations, error rates, user preferences, commands, settings, parameters, and/or the like. Therefore, what is needed are systems, methods, apparatus, computer-program products, and/or circuitry for on-die control circuitry capable of modifying the configuration, timing, and/or duration of memory control signals generated thereby after design, fabrication, and/or validation of the memory structure.

BRIEF DESCRIPTION OF THE DRAWINGS

The disclosure is described and explained with additional specificity and detail through the use of the accompanying drawings, which form a part thereof. The description of elements in various figures of the drawings may refer to elements of one or more other figures. Like numbers may refer to like elements in the figures, including alternate embodiments of like elements. The drawings depict only certain embodiments of the disclosure and are not therefore to be considered to be limiting of its scope.

DETAILED DESCRIPTION

Figure 1A:
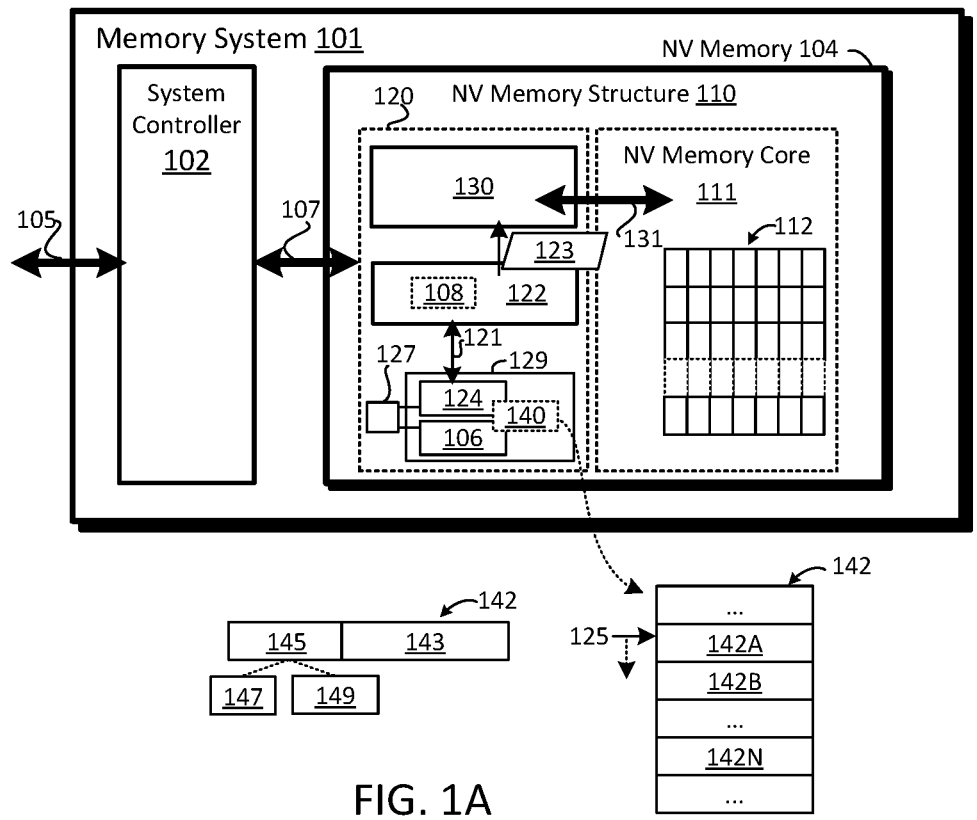
FIG. 1A is a schematic block diagram illustrating one embodiment of a memory system comprising a sequencer configured to adapt memory command, timing, and/or control signals, such as memory operation pulses.

As disclosed above, a NV memory system may comprise a sequencer, which may be configured to, inter alia, generate signal(s) for implementing various operations on a NV memory. The sequencer may be configured to generate signal(s) according to determined timing(s). In response to a request to implement a particular operation on the NV memory, the sequencer may be configured to produce a sequence of control and/or timing signals. The sequence of control and/or timing signals may configure control circuitry to implement the particular operation on the NV memory. The sequencer may be embodied within a same structure as the NV memory (e.g., in periphery circuitry of the NV memory). The sequencer may, therefore, be referred to as an "on-die" sequencer and/or may be embodied within peripheral circuitry of the NV memory. The sequencer may be designed to reduce the overhead imposed on the NV memory (e.g., have low size and/or power requirements). Moreover, the sequencer may be required to have a low latency such that delays for the sequencer to produce various control and/or timing signals do not adversely impact the latency for executing the corresponding operation(s) on the NV memory. In view of the foregoing, conventional on-die sequencers may be embodied as logic circuitry configured to generate determined control and/or timing signals in accordance with predetermined fixed timing(s). The signal(s) and/or timing(s) produced by the sequencer may, therefore, be determined by, inter alia, the logic circuitry embodying the sequencer. For example, the sequencer may comprise state machine circuitry, and the signal(s) and/or timing(s) produced thereby may be determined by one or more state transitions of the state machine circuitry. Accordingly, the signal(s) and/or timing(s) generated by the sequencer may not be capable of being modified after fabrication of the NV memory.

Disclosed herein are embodiments of a circuit structure for on-die control of memory operation and/or control pulses. The circuit structure may comprise a die comprising a NV memory cells, an NV memory array, a two-dimensional NV memory array, a three-dimensional NV memory array, and/or the like. The die may further comprise a sequencer configured to generate memory timing, control, and/or operational signals adapted to cause on-die control circuitry to implement memory operations within the memory array. The sequencer may be embodied within the die, such that the memory array and the sequencer are embodied within a same die. The sequencer may adapt the configuration, timing, and/or duration of the memory control signals in accordance with stored configuration data (as opposed to utilizing configuration data that is fixed at design and/or fabrication time, e.g., hardwired into the sequencer circuitry and/or other on-die control circuitry embodied on the die). Accordingly, the configuration, timing, and/or duration of the memory control signals generated by the sequencer to implement particular memory operations within the die may be modified, replaced, updated, and/or otherwise manipulated after the design and/or fabrication of the circuitry used to implement the sequencer and/or other on-die control circuitry on the die. The sequencer may be configured to read sequencer entries corresponding to respective memory operations from a memory unit, and generate control signals corresponding to the sequencer entries for a number of clock cycles specified by the sequencer entries, The generated control signals may be adapted to configure memory control circuitry embodied on the die to implement the respective memory operations. The sequencer entries may comprise a timer field and a signal field. In response to reading a particular sequencer entry from the memory unit, the sequencer may be configured to generate control signals corresponding to the signal field of the particular sequencer entry for a number of clock cycles specified by the timer field of the particular sequencer entry. The timing field may comprise an exponent and mantissa, and the number of clock cycles specified by a sequencer entry may be calculated as m×2^e, wherein m is the mantissa and e is the exponent.

The disclosed die may further comprise a bus configured to couple the sequencer to the memory unit. Sequencer entries may be communicated as data words on the bus. The data words on the bus may be divided into a timing region and a signal region. The number of clock cycles specified by the sequencer entries may be communicated via the timing region, and signal data defining the memory control signals to be generated by the sequencer may be communicated via the signal region. The memory unit may comprise one or more of a non-transitory memory, a persistent memory, a read only memory, a volatile memory, a random access memory, a static random access memory, a dynamic random access memory, and/or the like.

In some embodiments, the sequencer comprises fetch circuitry configured to access a sequencer entry from the memory unit, and output circuitry configured to generate control signals corresponding to the fetched sequencer entry for a number of clock cycles specified by the sequencer entry. The fetch circuitry may be further configured to read a timing entry that follows the fetched sequencer entry in a series of sequencer entries stored within the memory unit. The sequencer may further include decode circuitry configured to parse sequencer entries accessed by the fetch circuitry, the decode circuitry further configured to determine that processing of the series of sequencer entries is complete in response to parsing a last sequencer entry of the series accessed by the fetch circuitry. Completing the series of sequencer entries may comprise generating a sequence of control signal vectors, each control signal vector generated for a number of clock cycles specified by a corresponding sequencer entry of the series.

The sequencer may comprise state machine circuitry, the state machine circuitry comprising state logic configured to maintain a sequencer state, the sequencer state defining an output state for a plurality of memory control signals, output logic configured to output the plurality of memory control signals defined by the sequencer state maintained by the state logic and/or next state logic configured to determine a next sequencer state based on a sequencer entry stored within the memory unit, and to transition the state logic to the next sequencer state in response to the state logic maintaining the sequencer state for a determined number of clock cycles.

Disclosed herein are embodiments of a system for on-structure control of memory operation and/or control signals using configuration data capable of being modified after design and/or fabrication of the memory structure. The system may comprise a volatile memory comprising plurality of sequencer instructions, each sequencer instruction comprising timer data and signal data, a semiconductor structure comprising a plurality of non-volatile memory elements and control circuitry configured for implementing operations on selected non-volatile memory elements in response to memory control signals. The system may further comprise a sequencer embodied within the control circuitry of the semiconductor structure. The sequencer may be configured to execute sequencer instructions stored within the memory. The semiconductor structure may comprise one or more of a semiconductor substrate, a semiconductor wafer, a semiconductor layer, a memory chip, a memory package, a memory die, a Flash memory die, a NAND-Flash die, and a NOR-Flash die.

To execute a sequencer instruction, the sequencer may be configured to: load the sequencer instruction from the volatile memory, determine a cycle count from timer data of the loaded sequencer instruction, and output memory control signals in accordance with signal data of the loaded sequencer instruction for the determined cycle count, the memory control signals output by the sequencer configured implement at least a portion of the memory operation on the non-volatile memory element within the semiconductor structure. The timer data of the loaded sequencer instruction may comprise an exponent value and a mantissa value, and determining the cycle count may comprise calculating $m \times B^e$, where m is the mantissa value, e is the exponent value, and B is a base quantity (e.g., two). The system may further comprise a bus configured to communicatively couple the sequencer to the volatile memory. In some embodiments, a first section of the bus is designated for communication of timer data of respective sequencer instructions, and second section of the bus, different from the first region, is designated for communication of signal data of respective sequencer instructions. The sequencer may be further configured to load the sequencer instruction from a determined sequencer instruction address, and to determine the sequencer instruction address based on one or more of: an opcode of the memory operation and an address of the non-volatile memory element of the memory operation within the semiconductor structure. The sequencer may be configured to execute a series of sequencer instructions from a first sequencer instruction at the determined sequencer instruction address to a last sequencer instruction, and to identify the last sequencer instruction of the series based on one or more of timing data of the last sequencer instruction and signal data of the last sequencer instruction.

The system may further comprise a configuration manager configured to populate the volatile memory with the plurality of sequencer instructions from a non-volatile storage location. The non-volatile storage location may comprise one or more of a read only memory, a non-volatile memory, firmware storage, one or more of the non-volatile memory elements, and/or the like. The configuration manager may be further configured to write a modified sequencer instruction to one or more of the volatile memory and the non-volatile storage location in response to one or more of: receiving the modified sequencer instruction; and generating the modified sequencer instruction. The modified sequencer instruction may be generated in response to one or more of: a wear level of the non-volatile memory elements, and an error rate of the non-volatile memory elements.

A first sequencer instruction stored within the volatile memory may comprise first timing parameters for memory control signals pertaining to one or more of a read operation, a write operation, and an erase operation on non-volatile memory elements of the semiconductor structure. The system may further comprise a sequencer adjustment module configured to determine modified timing parameters for the memory control signals of the first sequencer instruction, and update the first sequencer instruction to replace the first timing parameters with the modified timing parameters. Updating the first sequencer instruction may comprise one or more of: overwriting at least a portion of the first sequencer instruction stored within the volatile memory, and overwriting at least a portion of the first sequencer instruction stored within non-volatile firmware storage for the control circuitry.

Disclosed herein are embodiments of a method for adapting the timing, configuration, and/or duration of memory control signals after design and/or fabrication of the memory. Embodiments of the disclosed method comprise storing configuration data comprising a plurality of sequencer vectors within a volatile random access memory (RAM) communicatively coupled to a sequencer circuit embodied within a non-volatile (NV) circuit structure, and implementing a series of sequencer vectors stored within the volatile RAM at the sequencer circuit in response to a request to implement an operation on NV memory cells of the NV circuit structure. Implementing a series of sequencer vectors may comprise transferring a data unit comprising a first sequencer vector of the series from the volatile RAM, interpreting the bit values of the data unit according to a determined layout for the sequencer vectors stored within the volatile RAM, and executing the first sequencer vector. In some embodiments, first bit values of the data unit comprise an output signal vector, second bit values comprise a mantissa, and third bit values comprise an exponent. Executing the first sequencer vector may comprise producing on-die memory control signals corresponding to the output signal vector of the first sequencer vector for a determined number of clock cycles. The determined number of clock cycles may be calculated as $m \times 2^e$, where m is the mantissa and e is the exponent of the first sequencer vector. In some embodiments, the method further comprises processing a next sequencer vector in the series in response to completing execution of the first sequencer vector.

The on-die memory control signals may be configured to cause one or more functional modules of the control circuitry to implement at least a portion of the memory operation. The on-die memory control signals may be configured to control operation of one or more of: charge pump circuitry configured to generate designated voltage potentials on selected word lines of the NV memory array, driver circuitry configured to generate designated voltage potentials on selected bit lines of the NV memory array, pulse generation circuitry configured to apply programming voltage pulses to selected NV memory cells of the NV memory array, sense circuitry configured to sense selected bit lines of the NV memory array (e.g., one or more sense amplifiers), and/or the like.

Embodiments of the disclosed method may further comprise determining an address for the data unit comprising the first sequencer vector of the series based on associations between memory operations and respective data unit addresses, transferring the data unit comprising the first sequencer from the determined data unit address, and reading a data unit comprising the next sequencer vector in the series from a next data unit address following the determined data unit address. The method may further include loading configuration data comprising the sequencer vectors into the volatile RAM from a non-volatile storage location during an initialization operation. In some embodiments, the method further includes receiving a modified sequencer vector, and writing the modified sequencer vector to one or more of the volatile memory and the non-volatile storage location. Writing the modified sequencer vector may comprise one or more of replacing the first sequencer vector with the modified sequencer vector in the configuration data and adding the modified sequencer vector to the configuration data.

Disclosed herein are embodiments of means for adapting the configuration, timing, and/or duration of on-die memory control signal sequences after design and/or fabrication of the memory die, comprising means for storing a plurality of sequencer timing vectors in a volatile random access memory (RAM) at respective addresses, each sequencer timing vector having a respective timing and control signal data, and means for executing a memory command on a non-volatile memory. Executing the memory command may comprise associating the memory command with an address of the volatile RAM, fetching a sequencer timing vector from the address associated with the memory command, and implementing the sequencer timing vector. Implementing the sequencer timing vector may comprise determining a timing parameter for the sequencer timing vector by use of a mantissa and exponent included in the timing data of the sequencer timing vector, and providing control timing signals corresponding to the control signal data of the sequencer timing vector to command execution circuitry in accordance with the determined timing parameter, the control timing signals configured to cause the command execution circuitry to execute at least a portion of the memory command on one or more non-volatile memory cells of the non-volatile memory. The disclosed may further comprise means for fetching a next sequencer timing vector from a next address of the volatile RAM, means for determining whether execution of the memory command on the non-volatile memory is complete based on one or more of timing data of the next sequencer timing vector and control signal data of the next sequencer timing vector, and means for implementing the next sequencer timing vector in response to determining that execution of the memory command on the non-volatile memory is not complete.

FIG. 1A is a schematic block diagram depicting one embodiment of a memory system 101 configured to adapt memory operation pulses after design and/or fabrication of the NV memory 104. The memory system 101 may comprise, inter alia, a system controller 102 and NV memory 104. The system controller 102 may be operatively coupled to the NV memory 104 through an interconnect 107. The interconnect 107 may comprise any suitable means for coupling the system controller 102 to the NV memory 104 and may include, but is not limited to: a bus, a parallel bus, a serial bus, and/or the like. The system controller 102 may be further configured to communicatively couple the memory system 101 to one or more computing devices by use of an interconnect 105. The interconnect 107 may comprise internal interconnection circuitry of the memory system 101, and the interconnect 105 may comprise an external interface of the memory system 101.

The NV memory 104 may comprise a NV memory structure 110. The NV memory structure 110 may comprise and/or embody a NV memory core 111 and corresponding control circuitry 120. As used herein, a "memory structure," such as the NV memory structure 110 of FIG. 1A, refers to structural element(s) and/or components that embody and/or are used to implement NV memory elements of the NV memory core 111 and/or the control circuitry 120. The NV memory structure 110 may comprise a semiconductor structure on which circuit components, such as control circuitry, signal routing circuitry, driver circuitry, memory circuitry, and/or other components are formed. The NV memory structure 110 may include, but is not limited to: a substrate, a semiconductor, a semiconductor substrate, a semiconductor wafer, a semiconductor layer, an integrated circuit, a die, a plane, a Flash memory die, a NAND-Flash die, a NOR-Flash die, a package, a chip, and/or the like.

As illustrated in FIG. 1A, the NV memory core 111 and the control circuitry 120 may be implemented on and/or embodied within the same NV memory structure 110 (e.g., the same substrate, semiconductor, layer, die, plane, package, chip, and/or the like). Therefore, the control circuitry 120 may comprise "on-die" control circuitry of the NV memory 104 (e.g., may be referred to as "on-die" control circuitry 120, "on-structure" control circuitry 120, local control circuitry 120, and/or the like). The NV memory core 111 may be embodied and/or disposed within a memory region of the NV memory structure 110 and the control circuitry 120 may be embodied and/or disposed within a peripheral region of the NV memory structure 110. Although FIG. 1A depicts a memory system 101 comprising a single NV memory 104 having a single NV memory structure 110, the disclosure is not limited in this regard and encompasses embodiments that include any number of NV memories 104 and/or NV memory structures 110 (e.g., four, eight, or more NV memory structures 110), each comprising respective NV memory core(s) 111 and/or control circuitry 120.

The NV memory structure 110 may comprise any suitable type of NV memory core 111 comprising any suitable type of NV memory elements and/or cells in any suitable arrangement and/or configuration. The NV memory core 111 may comprise non-transitory memory, solid-state memory, Flash memory, NAND-type Flash memory, NOR-type Flash memory, Programmable Metallization Cell (PMC) memory, Silicon-Oxide-Nitride-Oxide-Silicon (SONOS) memory, Resistive RAM (RRAM) memory, Floating Junction Gate RAM (FJG RAM), ferroelectric memory (FeRAM), magnetoresistive memory (MRAM), phase change memory (PRAM), Electrically Erasable Programmable Read-Only Memory (EEPROM), and/or the like.

The NV memory core 111 may comprise a plurality of NV memory elements 112, which may be capable of storing data. The NV memory elements 112 may comprise one or more NV memory cells, which may be arranged into respective pages, divisions, blocks, meta blocks, erase blocks, planes, banks, and/or the like. In some embodiments, the NV memory core 111 comprises one or more of a memory array, a two-dimensional memory array, a three-dimensional memory array, and/or the like. As disclosed in further detail herein, in some embodiments, the NV memory core 111 comprises a NAND memory array.

The control circuitry 120 may comprise a sequencer 122 and one or more functional modules 130. The sequencer 122 may be configured to generate memory control (MC) signals, which may be adapted to configure functional modules 130 of the control circuitry 120 to implement respective memory operations (and/or portions thereof) within the NV memory 104. The MC signals generated by the sequencer 122 may, therefore, include, but are not limited to: control signals, control pulses, memory control pulses, timing signals, memory timing signals, timing pulses, trigger signals, trigger pulses, command signals, command pulses, operation signals, operation pulses, Command, Timing, Control (MC) signals, and/or the like. The MC signals generated by the sequencer 122 may be communicated via respective conductors, lines, channels, vias, through silicon vias (TSV), wires, traces, buses, interconnects, switches, routers, and/or the like. The control circuitry 120 may be configured to implement operations pertaining to the NV memory 104 in response to the MC signals generated by the sequencer 122. The memory operations implemented by the control circuitry 120 in response to the MC signals generated by the sequencer 122 may include, but are not limited to: program operations, storage operations, write operations, read operations, read before write operations, erase operations, reset operations, verify operations, grooming operations, garbage collection operations, and/or the like.

In the FIG. 1A embodiment, a set of MC signals generated and/or output by the sequencer 122 may be referred to as an MC signal vector 123. As used herein, an MC signal vector 123 refers to a designated state of one or more MC signals. The state of an MC signal may refer to any suitable characteristic and/or information represented by the MC signal, which may include, but is not limited to: an assertion state (e.g., "asserted" or "de-asserted"), a binary value, a multi-state value (e.g., a value within a determined range), an analog value, a voltage potential (and/or range of voltage potentials), an electrical characteristic (e.g., impedance, resistance, capacitance, inductance), and/or the like.

The sequencer 122 may be configured to generate MC signal vectors 123 according to determined timings. As used herein, the timing of a signal vector, such as an MC signal vector 123, refers to the time for which the one or more MC signals of the MC signal vector 123 are maintained at a determined state. The duration of an MC signal vector 123 may span the time from which each of the one or more MC signals comprising the MC signal vector 123 are in the determined state until the time any one of the MC signals of the MC signal vector 123 changes from the determined state thereof (e.g., transitions from asserted to de-asserted, and/or the like). The duration of an MC signal vector 123 may correspond to an absolute time, a time offset, a number of clock cycles (or other timing reference), and/or the like.

The functional modules 130 of the control circuitry 120 may be communicatively coupled to the NV memory core 111, and may be configured to implement operations on selected NV memory elements 112 within the NV memory core 111 in response to MC signals generated by the sequencer 122 (e.g. MC signal vectors 123). The functional modules 130 may be configured to address selected NV memory elements 112, couple the selected NV elements 112 to power, bias the selected NV memory elements 112, drive signal(s) coupled to the selected NV memory elements 112 (e.g., program the selected NV memory elements 112), sense the selected memory elements 112 (e.g., read data stored within the selected NV memory elements 112), and so on. One or more of the functional modules 130 may comprise and/or be communicatively coupled to routing circuitry 131, which may be configured to address selected NV memory elements 112 within the NV memory core 111. The routing circuitry 131 may be further configured to couple the selected NV memory elements 112 to signal(s) driven by one or more of the functional modules 130 (e.g., couple word lines of the selected NV memory elements 112 to bias a voltage potential generated by the control circuitry 120), sense the selected NV memory elements 112 (e.g., couple bit lines of the selected NV memory elements 112 to one or more of the functional modules 130), and/or the like.

By way of non-limiting example, the sequencer 122 may configure the control circuitry 120 to execute an operation to read data from an addressed NV memory element 112 by, inter alia, generating a sequence of MC signal vectors 123 according to a determined timing. Implementing the read operation may comprise generating a first MC signal vector 123 configured to cause one or more functional modules 130 of the control circuitry 120 to drive word lines of the addressed NV memory element 112 to determined voltage levels and/or couple bit lines of the addressed NV memory element 112 to source and/or drain terminals. The sequencer 122 may maintain the first MC signal vector 123 for a determined time period (e.g., a determined number of clock cycles), which may configure the functional modules 130 to drive the word lines (and activate the bit lines) for the determined time period. After the determined time period, the sequencer 122 may generate a second, different MC signal vector 123, which may comprise changing the state of one or more of the MC signals thereof. The second MC signal vector 123 may be configured to cause the functional modules 130 to sense a current and/or voltage on the bit lines of the addressed NV memory element 112 and/or latch data sensed on the bit lines in a data buffer.

As disclosed above, conventional on-die control and/or sequencer circuits may generate command, timing, and/or control signals in accordance with a determined configuration, which may be fixed at design and/or fabrication time. The configuration of such conventional control and/or sequencer circuits may determine the series of MC signals used to implement particular memory operations, and may determine the respective timings of the MC signals. It may not be feasible to modify the configuration of the control and/or sequencer circuits (and corresponding MC signal timings) after design and/or fabrication. For example, the configuration and/or timing of the MC signals generated by conventional one-die components may be embodied in the sequencer circuitry itself (e.g., as hardwired state transitions of a state machine circuit). Accordingly, modifications to the configuration and/or timing of the MC signals produced by conventional on-die control and/or sequencer circuitry may require substantial re-design and/or re-fabrication. Since conventional control and/or sequencer circuitry may be embodied on the memory die (e.g., within a peripheral region of the memory die), such re-design and/or re-fabrication may involve the re-design and/or re-fabrication of the memory die (and/or other memory structures).

In the FIG. 1A embodiment, the configuration and/or timing of the MC signal vectors 123 generated by the sequencer 122 may be defined, at least in part, by sequencer configuration data 140, which may be modified, revised, and/or otherwise manipulated after design and/or fabrication of the NV memory 104. The sequencer configuration data 140 may be modified, revised, and/or otherwise manipulated during operation of the NV memory 104 and/or in response to usage conditions, wear levels, testing conditions, error rates, user preferences, commands, settings, parameters, and/or the like. The sequencer 122 may, therefore, be capable of modifying the MC signal vector(s) 123 generated thereby after design and/or fabrication (based on data stored within the memory system 101). Accordingly, the sequencer 122 may comprise and/or be referred to as a programmable sequencer 122, a programmable on-die sequencer 122, a programmable on-die controller 122, an adaptive sequencer 122, an adaptive on-die sequencer 122, an adaptive on-die controller 122, and/or the like.

In some embodiments, the sequencer configuration data 140 is managed by a configuration manager 127. The configuration manager 127 may maintain the sequencer configuration data 140 in a memory unit 129. The memory unit 129 may comprise any suitable memory and/or storage means including, but not limited to: a volatile memory, a random access memory, a static random access memory, a dynamic random access memory, a persistent memory, a non-volatile memory, a non-transitory memory, and/or the like. In the FIG. 1A embodiment, the memory unit 129 comprises a non-transitory storage 106, which may comprise any suitable persistent, non-transitory, and/or non-volatile storage location including, but not limited to: an EEPROM, ROM, firmware storage for the memory system 101, firmware storage for the NV memory 104, firmware storage for the NV memory structure 110, firmware storage for the control circuitry 120 (and/or NV memory core 111), and/or the like. The configuration manager 127 may be configured to manage the firmware for the memory system 101, NV memory 101, NV memory structure 110, control circuitry 120, and/or the like. The configuration manager 127 may be configured to load sequencer configuration data 140 into the non-transitory storage 106 in response to one or more commands received via the interconnect(s) 105 and/or 107. Alternatively, or in addition, the sequencer configuration data 140 may be prepopulated in the non-transitory storage 106 (e.g., may be prepopulated during design, fabrication, initial testing and/or verification of the memory system 101).

The memory unit 129 may further comprise a volatile memory 124. The configuration manager 127 may be configured to transfer the sequencer configuration data 140 to the volatile memory 124 of the memory system 101 during initialization (e.g., during initial bootstrap of the memory system 101). Alternatively, in some embodiments, the sequencer 122 may be configured to access the sequencer configuration data 140 directly from the non-transitory storage 106 (e.g., as illustrated in FIG. 1D). The volatile memory 124 may comprise a random access memory (RAM), such as a static RAM (SRAM), dynamic RAM (DRAM), and/or the like. As illustrated in FIG. 1 the volatile memory 124 and/or non-volatile storage 106 may be embodied within the NV memory 104 and/or NV memory structure 110. One or more of the volatile memory 124 and/or non-transitory storage 106 may be embodied within the periphery region of the NV memory structure 110 and/or may be implemented as part of the control circuitry 120. Alternatively, or in addition, the non-transitory storage 106 may comprise and/or correspond to one or more NV memory elements 112 of the NV memory core 111. The disclosure is not limited in this regard, however. In some embodiments, the volatile memory 124 may be embodied separately from the NV memory 104 and/or NV memory structure 110. The volatile memory 124 may comprise a separate chip, package, die, and/or the like.

The sequencer 122 may be communicatively coupled to the volatile memory 124 through, inter alia, a memory bus 121. During operation, the sequencer 122 may be configured to access sequencer configuration data 140 stored within the volatile memory 124, and use the accessed sequencer configuration data 140 to determine the configuration and/or timing of the MC signal vectors 123 generated thereby. The sequencer configuration data 140 stored within the volatile memory 124 and/or non-transitory storage 106 may be modified, replaced, and/or otherwise manipulated after design and/or fabrication of the NV memory 104. Changes to the sequencer configuration data 140 may be used to modify, replace, and/or otherwise manipulate the configuration, timing, and/or duration of the MC signal vectors 123 generated by the sequencer 122 to implement particular memory operations.

In some embodiments, the sequencer configuration data 140 comprises a plurality of entries 142, each entry 142 defining a respective operating state of the sequencer 122. Each entry 142 may configure the sequencer 122 to output one or more MC signals for a specified duration. The entries 142 may define respective MC signal vectors 123 to be generated by the sequencer 122. As disclosed above, a "signal vector," such as an MC signal vector 123, refers to a set of one or more signals, each having a respective state. As disclosed above, the state of a signal, such as an MC signal generated by the sequencer 122 may refer to any suitable characteristic and/or information represented by the signal, which may include, but is not limited to: an assertion state (e.g., "asserted" or "de-asserted"), a binary value, a multi-state value (e.g., a value within a determined range), an analog value, a voltage potential (and/or range of voltage potentials), an electrical characteristic (e.g., impedance, resistance, capacitance, inductance), and/or the like.

As disclosed above, the entries 142 of the sequencer configuration data 140 may be configured to cause the sequencer 122 to output a designated MC signal vector 123 for a specified duration. The entries 142 may, therefore, define the configuration, timing, and/or duration of MC signal vectors 123 generated by the sequencer 122 during implementation of particular memory operations within the NV memory 104. The entries 142 may comprise respective operational states of the sequencer 122 and/or may comprise instructions configured to cause the sequencer 122 to transition to specified operational states. As used herein, the "operational state" of the sequencer 122 refers to configuration, timing, and/or duration of an MC signal vector 123 being generated by the sequencer 122. The sequencer 122 may execute respective entries 142 of the sequencer configuration data 140, which may comprise transitioning the sequencer 122 to the operational state defined by the entry 142. Executing a plurality of entries 142 in sequence may configure the sequencer 122 to transition through a plurality of different operational states, each operational state comprising the sequencer 122 outputting a respective MC signal vector 123 having the configuration, timing and/or duration defined by the respective entry 142. Executing the plurality of entries 142 in sequence may, therefore, configure the sequencer 122 to generate an MC signal pattern or MC signal sequence, which may be adapted to configure functional modules 130 of the control circuitry to implement a sequence of memory operations pertaining to respective memory operations and/or commands. Accordingly, the entries 142 of the sequencer configuration data 140 may comprise and/or be referred to as "timing entries," "timing vectors," "sequencer entries," "sequencer vectors," "MC entries," "MC vectors," and/or the like. An ordered sequence of the entries 142 may be referred to as an "entry sequence," a "timing sequence," an "MC sequence," and/or the like. A entry 142 may be embodied and/or represented using any suitable data and/or data structure, such as a data word (e.g., an N-bit quantity), a tuple, a collection of data values, one or more data fields and/or attributes, a table entry, a list entry, an instruction, a command, and/or the like.

FIG. 1A depicts one embodiment of an entry 142 of the sequencer configuration data 140. The entry 142 may comprise signal data 143 and timing data 145. The signal data 143 may define the MC signal vector 123 to be generated, asserted, output, and/or otherwise provided by the sequencer 122. The timing data 145 may specify timings for the defined MC signal vector 123 (e.g., the amount of time the sequencer 122 is to generate, assert, output and/or provide the defined MC signal vector 123). The signal data 143 may define the state of one or more MC signals comprising the MC signal vector 123 to be generated by the sequencer 122, as disclosed herein. The timing data 145 may specify timing information using any suitable format and/or timing reference. In some embodiments, the timing data 145 may comprise an absolute time value and/or time offset. The timing data 145 may specify a particular amount of time for which the sequencer 122 is to output the defined MC signal vector 123, such as a number of seconds, milliseconds, microseconds, nanoseconds, and/or the like. The units and/or scale for the timing data 145 may be adapted to the NV memory 104 (e.g., correspond to time units and/or time scale(s) associated with the MC signals used within the NV memory 104). Alternatively, the timing data 145 may specify a time offset from a particular trigger condition (e.g., a specified number of milliseconds after assertion of a specified signal). Alternatively, or in addition, the timing data 145 may correspond to a time reference, such as a clock signal. As used herein, a "clock signal" refers to an oscillating signal having a particular cycle time and/or period, which may be generated by and/or provided to the sequencer 122 and/or other control circuitry 120. The timing data 145 may specify the number of clock cycles the sequencer 122 is to generate, assert, output and/or otherwise provide the defined MC signal vector 123. Accordingly, the timing data 145 may comprise a clock cycle count, number, quantity, and/or the like.

Due to cost, power, and/or other considerations, the volatile memory 124 may have a limited capacity available for storing the sequencer configuration data 140. Accordingly, the entries 142 of the sequencer configuration data 140 may be configured to occupy a minimal amount of storage capacity (e.g., be represented by a minimal number of bits and/or bit values). It may be advantageous for the timing data 145 of the entries 142 to be capable of spanning a large range. In some embodiments, the timing data 145 of the entries 142 are configured to represent a large range of time durations using a small number of bits. In one embodiment, the timing data 145 may be represented using a fixed number of bits (e.g., 12 bits). If the 12 bit is used to represent the timing data 145 as an unsigned integer, the timing data 145 may be capable of spanning a range of values from 0 to $2^b-1$, where b is the number of bits comprising the timing data 145 (e.g., a range from 0 to 4095 for timing data 145 comprising 12 bits). The range of values corresponding to conventional representations may be insufficient (e.g., the timing information may be required to span larger ranges). Spanning larger ranges may require entries 142 to be split (e.g., split into two entries 142 defining the same MC signal vector 123). In some embodiments, the data bits comprising the timing data 145 may be leveraged to span a larger range of timing values by, inter alia, using alternative techniques for encoding and/or representing the timing information within the timing data 145 (other than conventional unsigned integer and/or similar representations).

As illustrated in FIG. 1A, in some embodiments, the timing data 145 of the entries 142 may comprise an exponent 147 and mantissa 149. The number of clock cycles represented by the timing data 145 may be a product of the exponent 147 and mantissa 149 (e.g., $m \times B^e$ where m is the mantissa 149, e is the exponent 147, and B is a base quantity). As disclosed above, the timing data 145 may be represented using a fixed number of bits (e.g., 12 bits). The timer exponent 147 may comprise a 4 bit quantity (ranging from 0 to 16) and the mantissa 149 may comprise an 8 bit quantity (ranging from 0 to 255). Utilizing a base quantity B of 2, the timing values capable of being represented by the timing data 145 may span a range from 0 to a maximum value of 16,711,680. The maximum value corresponds to the maximum values of the exponent 147 and mantissa 149 ($255 \times 2^{16}$). The range of values capable of being represented by the 12-bit quantity allocated for the timing data 145 may be significantly larger than the range spanned by conventional representations, such as a conventional unsigned integer representation which is capable of spanning a much more limited range of values from 0 to 4095.

As disclosed above, the sequencer 122 may access the sequencer configuration data 140 stored within the volatile memory 124 to, inter alia, generate the MC signal vectors 123 required to perform respective memory operations within the NV memory 104. As illustrated in FIG. 1A, the sequencer 122 may perform a determined memory operation (represented as memory operation 108 in FIG. 1A). The memory operation 108 may correspond to a command received via the interconnect 107 and/or 105. Alternatively, or in addition, the memory operation 108 may correspond to an internal management operation (e.g., a data refresh operation). The memory operation 108 may pertain to one or more addresses, which may correspond to one or more NV memory elements 122 within the NV memory core 111.

The sequencer 122 may be configured to execute the memory operation 108 by, inter alia, accessing the sequencer configuration data 140 stored within the volatile memory 124 and using the accessed sequencer configuration data 140 to generate a timed sequence of MC signal vectors 123. The sequencer 122 may be configured to access an entry 142 corresponding to the memory operation 108 from the volatile memory 124, and execute the accessed entry 142. Executing the accessed entry 142 may comprise generating the MC signal vector 123 defined by signal data 143 of the accessed entry 142 for the time duration specified by timing data 145 of the accessed entry 142. As disclosed above, the MC signal vector 123 produced by the sequencer 122 during execution of the accessed entry 142 may configure functional modules 130 of the control circuitry 120 to implement the memory operation 108 (and/or portions thereof).

In some embodiments, the sequencer 122 may be further configured to access and/or execute a next entry 142 in response to completing execution of the accessed entry 142 (e.g., access and/or execute a series of entries 142). As illustrated in FIG. 1A, in some embodiments, the entries 142 of the sequencer configuration data 140 may be arranged within the volatile memory 124 in accordance with a determined order (e.g., a sequential order). The sequencer 122 may be configured to execute a series of entries 142 in the determined order (e.g., execute a series of sequencer instructions or commands). In such embodiments, executing the memory operation 108 may comprise the sequencer 122 accessing and/or executing a series of entries (e.g., entries 142A-N). The sequencer 122 may be configured to identify the first entry 142A of the series based on, inter alia, characteristics of the memory operation 108, such as operation type, address, and/or the like. In some embodiments, the sequencer 122 maintains an address pointer 125, which may correspond to one or more addresses of the volatile memory 124. In response to the memory operation 108, the sequencer 122 may set the address pointer 125 to a determined address (e.g., an address associated with the memory operation 108), and may execute the first entry 142A from the volatile memory 124 by use of the address pointer 125.

After completing execution of the first entry 142A, the sequencer 122 may be further configured to access and/or execute a next entry 142 associated with the memory operation 108 (e.g., entry 142B). Accessing the next entry 142B may comprise reading the volatile memory 124 at next address of the volatile memory 124. The sequencer 122 may determine the next address by, inter alia, incrementing the address of the first entry 142A and/or incrementing the address pointer 125 according to the determined order. In some embodiments, the sequencer 122 may be configured to increment the address and/or address pointer 125 by one (e.g., if the first entry 142A is stored at address α within the volatile memory 142A the sequencer may access the next entry 142B at address α+1). Following completion of the next entry 142B, the sequencer 122 may continue accessing and/or executing the following entries 142C-N in sequence, as disclosed herein.

The series of entries 142A-N may configure the sequencer 122 to generate, assert, output, and/or otherwise provide a sequence of MC signal vectors 123, each MC signal vector 123 being generated in sequence for a designated number of clock cycles. Accordingly, executing the series of entries 142A-N may configure the sequencer 122 to produce an MC pattern or MC sequence 126 adapted to configure the control circuitry 120 to implement the memory operation 108 within the NV memory 104 (by use of one or more functional modules 130 of the control circuitry 120).

Figure 1B:
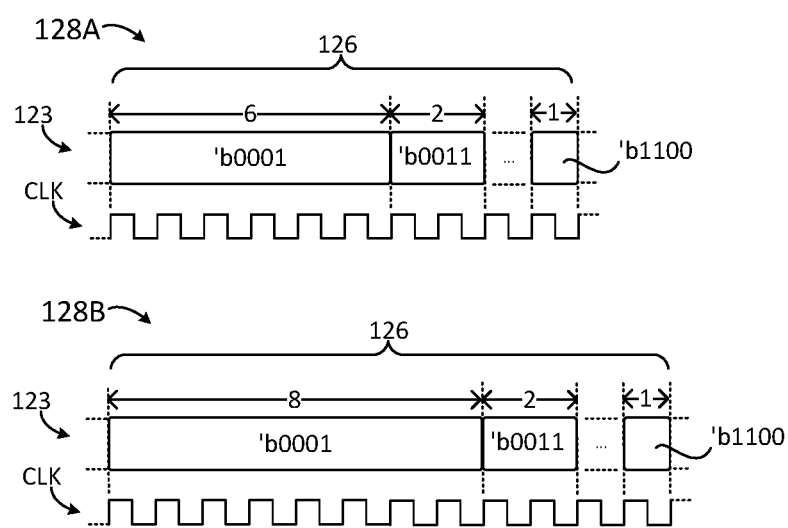
FIG. 1B depicts timing diagrams corresponding to exemplary memory control signal sequences generated by the disclosed sequencer.

By way of non-limiting example, FIG. 1B depicts an MC sequence 126 generated by the sequencer 122 during execution of exemplary sequencer configuration data 140, comprising the following entries 147A-N:

| Entry 142 | Timing Data 145 | Signal Data 143 |
|---|---|---|
| 142A | 6 | 'b0001 |
| 142B | 2 | 'b0011 |
| ... | ... | ... |
| 142N | 1 | 'b1100 |

The entries 142A-N may comprise an entry sequence adapted for execution of particular type(s) of memory commands and/or operations, such a read operation, a write operation, an erase operation, and/or the like (e.g., memory operation 108 illustrated in FIG. 1A). The sequencer 122 may be configured to execute the memory operation by, inter alia, accessing and/or executing the series of entries 142A-N in sequence from a first entry 142A to a last entry 142N. As illustrated in exemplary timing diagram 128A, executing the first entry 142A may comprise asserting a first MC signal vector 123 comprising bit values 'b0001 defined by the signal data 143 of the first entry 142A (each bit value being communicated via a respective MC signal) for the duration specified by the timing data 145 of the first entry 142A (e.g., 6 clock cycles). Following execution of the first entry 142A, the sequencer 122 may access and/or execute a next entry 142B, as disclosed herein. Executing the entry 142B may comprise generating a second MC signal vector 123 defined by the signal data 143 of the entry 142B for two clock cycles (per the timing data 145 of the entry 142B). The sequencer 122 may continue accessing and/or executing entries 142A-N until the last entry 142N is completed (e.g., by generating the MC signal vector 123 defined by the signal data 143 of entry 142N (bit values 'b1100) for one clock cycle, per the timing data 145 thereof). In some embodiments, the sequencer 122 may be further configured to output a default MC signal vector 123 in response to completing execution of the last entry 142N. The default MC signal vector 123 may comprise a NOOP and/or idle MC signal vector 123, which may be configured to idle one or more functional modules 130 of the control circuitry 120. The sequencer 122 may maintain the default MC signal vector 123 until a next memory command is executed.

The MC sequence 126 produced by the sequencer 122 during execution of the entries 142A-N may be communicated to functional modules 130 of the control circuitry 120, and may configure the functional modules 130 to implement the memory operation 108 on the NV memory 104, as disclosed herein. The configuration of the MC sequence 126, including the configuration, timing, and/or duration of the respective MC signal vectors 123 may be modified, revised, replaced, and/or otherwise manipulated by, inter alia, modifying the sequencer configuration data 140 within the memory unit 129 (e.g., volatile memory 124 and/or non-transitory storage 106). Accordingly, the sequencer 122 maybe configured to adapt to different usage conditions, wear levels, error rates, user preferences, testing conditions, and/or the like, after design and/or fabrication of the NV memory 104.

In one non-limiting example, the MC sequence 126 disclosed above may be adapted for execution of a particular type(s) of memory command and/or operations (e.g., read operations). The MC signal vector 123 generated by the sequencer 122 in accordance with the first entry 142A may configure one or more functional modules 130 of the control circuitry 120 to, inter alia, drive a voltage potential on one or more word line(s) of the addressed NV memory element 112 to designated voltage levels for the specified time period (e.g., 6 clock cycles). the next entry 142B may configure one or more functional modules 130 of the control circuitry 120 to sense a current and/or voltage potentials on the addressed NV memory element 112. Accordingly, the time durations specified by the first entry 142A and/or second entry 142B may determine timing constraints and/or timing margins for the read operation. For example, the duration of the first entry 142 may determine the amount of time allotted for charging the word lines to the designated voltage potential(s) and/or time allowed for settling the bit line before the subsequent sense operation of the second entry 142B is performed. The time duration specified by the second entry 142B may determine the amount of time allowed for the sense operation (e.g., settle time, sense time). The second entry 142B (and/or another subsequent entry 142 of the entry sequence) may determine the time at which data sensed on the bit lines are latched.

In some situations, one or more timing(s) defined by the entries 142A-N may be determined to be insufficient, which may result in increased read error rates (and/or read failures). Alternatively, certain timing(s) determined to be too long, which may result in read disturb errors, reduced performance, and/or increased power consumption. The sequencer configuration data 140 may be modified to adjust the timings(s) defined by the respective entries 142A-N, which may configure the sequencer 122 to generate MC signal vectors 123 corresponding to the adjusted timing(s) during execution of subsequent commands/operations. For example, entry 142A may be modified to change the specified time duration thereof, which may result in changing the time which the word line(s) are charged, pre-charged, or biased before corresponding sense operations are performed (as defined by entry 142B). In some embodiments, modifications to the sequencer configuration data 140 may be initiated by the control circuitry 120 and/or system controller 104. As disclosed in further detail herein, such modifications may be initiated in response to determined conditions, such as wear levels, error rates, and/or the like. Alternatively, or in addition, modifications to the sequencer configuration data 140 may be initiated by other components and/or processes, which may include, but are not limited to: built-in system-test (BIST) modules, error detection and mitigation components, host computing devices, operating systems, file systems, drivers, diagnostic processes, user processes, user commands (during testing and/or evaluation), and/or the like. For example, a user may modify the sequencer configuration data 140 in order to test alternative configurations of the NV memory 104, test alternative configuration(s), timing(s), and/or duration(s) of particular MC signal vectors 123 and/or particular MC sequences 126 implemented by the sequencer 122 for particular types of memory commands or operations.

In the non-limiting example above, modifying the sequencer configuration data 140 may comprise modifying the timing data 145 of entry 142A to selectively increase, or decrease, the specified duration of the MC signal vector 123 defined by the entry 142A. In the following modified sequencer configuration data 140, the entry 142A is modified to increase the duration of the MC signal vector 123 output by the sequencer 122 from six cycles to eight cycles:

| Entry 142 | Timing Data 145 | Signal Data 143 |
|---|---|---|
| 142A | 8 | 'b0001 |
| 142B | 2 | 'b0011 |
| ... | ... | ... |
| 142N | 1 | 'b1100 |

Modifying the sequencer configuration data 140 may comprise modifying, updating, replacing, and/or otherwise manipulating the entry 142A of the sequencer configuration data 140 as stored within the non-volatile storage 106 and/or volatile memory 124. In response to a subsequent read operation, the sequencer 122 may access the modified sequencer configuration data 140, which may comprise accessing and/or executing the series of entries 142A-N, including the modified entry 142A. As illustrated in timing diagram 128B, execution of the MC sequence 126 comprising entries 142A-N (including modified entry 142A) may result in the sequencer 122 generating the first MC signal vector 123 (corresponding to bit values 'b0001) for eight clock cycles rather than six clock cycles and/or shifting the time at which the MC signal vectors 123 of subsequent entries 142B-N are output by the sequencer 122 by two clock cycles (which may increase the latency of the corresponding memory command and/or operation).

As disclosed above, modifying the configuration and/or timing of the MC signals generated by conventional control and/or sequencer circuitry may require such circuitry to be re-designed and/or re-fabricated. Accordingly, conventional on-die control and/or sequencer implementations may not be capable of adapting to different usage conditions, wear levels, error rates, user preferences, testing conditions, and/or the like, after design and/or fabrication of the NV memory 104.

Figure 1C:
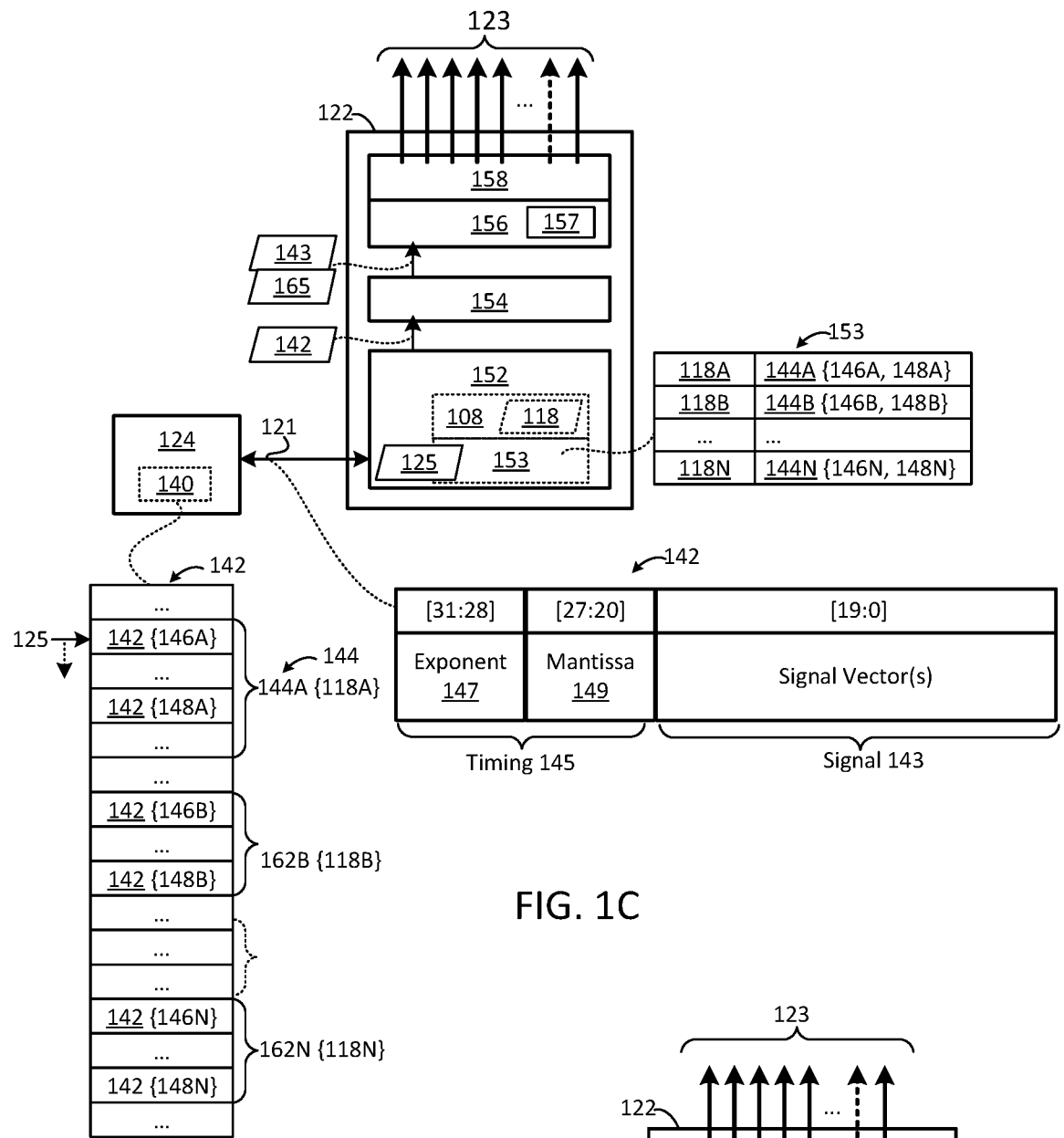
FIG. 1C is a schematic block diagram illustrating another embodiment of a sequencer configured to adapt memory command, timing, and/or control signals by use of sequencer configuration data.
Figure 1D:
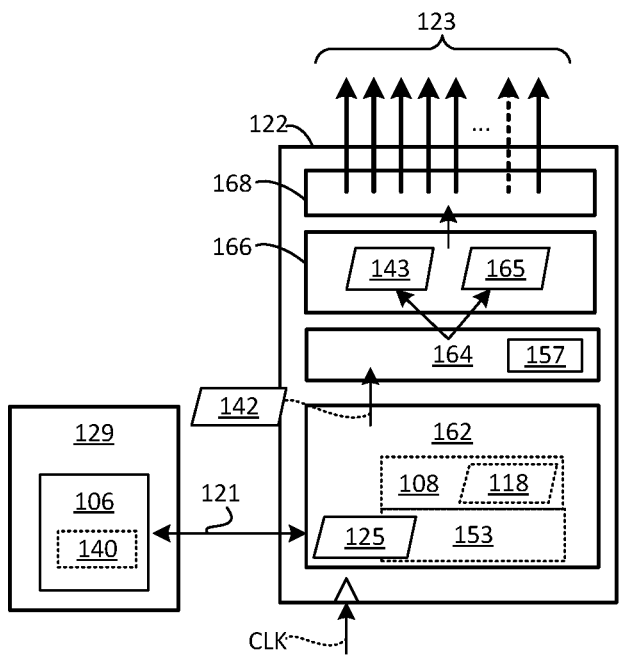
FIG. 1D is a schematic block diagram illustrating another embodiment of a sequencer, as disclosed herein.

FIG. 1C depicts further embodiments of the sequencer 122 and/or sequencer configuration data 140, as disclosed herein. As shown in FIG. 1C, the sequencer configuration data 140 may comprise one or more entries 142. The entries 142 may be arranged in a determined order within the volatile memory 124.

In some embodiments, the entries 142 of the sequencer configuration data 140 may be embodied as fixed-size data units. The size and/or configuration of the fixed-sized data units may be adapted in accordance with a configuration of the volatile memory 124 and/or bus 121 (e.g., may be adapted to correspond to a data word size and/or configuration of the volatile memory 124 and/or bus 121). In the FIG. 1C embodiment, the volatile memory 124 may be configured to address respective 32-bit data units, and the bus 121 may be configured to communicate 32-bit data units (e.g., may be configured to communicate 32-bit data units substantially in parallel). Accordingly, in the FIG. 1C embodiment, the entries 142 of the sequencer configuration data 140 may comprise and/or be embodied as 32-bit data units stored at respective addresses within the volatile memory 124.

The entries 142 may comprise respective portions (e.g., fields, quantities, and/or values), such as signal data 143, timing data 145, and so on. The system controller 102 and/or control circuitry 120 of the memory system 101 may be configured to store the fixed-sized data units comprising the entries 142 in a determined format and/or layout within the volatile memory 124. The determined format and/or layout may comprise storing respective portions of the entries 142 at designated bit locations within the fixed-sized data units. As illustrated in FIG. 1C, the signal data 145 of each entry 142 may be stored at first designated bit locations (e.g., bits [19:0]), and the timing data 145 of each entry 142 may be stored at second designated bit locations (e.g., bits [31:20]). The sequencer 122 and/or volatile memory 124 may be further configured to communicate the entries 142 in accordance with the determined format and/or layout of the fixed-sized data units. The bus 121 may be divided into respective regions or sections, each designated for communicating a respective portion of an entry 142 (e.g., a respective field, or sub-field of the entry 142). In some embodiments, a first section of the bus 121 is designated for communicating signal data 143 (e.g., a signal field of the entry 142) and a second section of the bus 121 is designated for communicating timing data 145 (e.g., a timer field of the entry 142). The second section of the bus 121 may be further divided into sub-sections for communication an exponent and/or mantissa of the entries 142 (e.g., sub-sections of the second section of the bus 121 may be designated for communicating respective exponent and/or mantissa sub-fields of the entries 142). In one embodiment, data bits [19:0] of the bus 121 are designated for communication of signal data 143 of respective entries 142 and data bits [31:20] of the bus 121 are designated for communication of timing data 145 of the respective entries. Data bits [19:0] of the bus may comprise a signal region of the bus 121, and data bits [31:20] may comprise a timing region of the bus 121. The timing region of the bus 121 may be further divided into an exponent region and a mantissa region, which may comprise sub-regions and/or sub-sections of the timing region.

By way of non-limiting example, an exemplary entry 142 of the sequencer configuration data 140 may comprise a 32-bit quantity having the following hexadecimal value 0x23CADD1. According to the determined format and/or layout of the entry 142 disclosed above, the signal data 143 of the exemplary entry 142 may comprise 0xCADD1 (or 'b1100, 'b1010, 'b1101, 'b1101, 'b0001), and the timing data 145 may comprise 0x23. The timing data 145 may comprise an exponent 147 and mantissa 149. The exponent 147 may be 2 (per the data bits at [31:28]) and the mantissa 149 may be 3 (per the data bits at [27:20]). The number of clock cycles specified by the exemplary entry 142 may be calculated as $3 \times 2^2$ (12 cycles). The exemplary entry 142 may, therefore, configure the sequencer 122 to output an MC signal vector 123 corresponding to data bits 'b1100, 'b1010, 'b1101, 'b1101, 'b0001 for a duration of 12 clock cycles.

Representing the entries 142 within the volatile memory 124 as fixed-size data units capable of being efficiently communicated via the bus 121, and designating regions of the bus 121 for communication of respective portions of the entries 142, may minimize the latency for the sequencer 122 to access, parse, and/or otherwise process entries 142 stored within the volatile memory 124. The latency for accessing, parsing, and/or otherwise processing the entries 142 may be significantly lower than the latencies and/or timings of the corresponding memory operations, such that delays imposed by the sequencer 122 (if any) do not contribute to the overall latency of the corresponding operations implemented within the NV memory 104 by the control circuitry 120 in response to the MC signal vector(s) 123 generated by the sequencer 122. Moreover, representing timing data 145 using exponent 147 and mantissa 145 quantities may enable the entries 142 of the sequencer configuration data 140 to span a large range of timing values while minimizing the amount of storage capacity required to store such entries 142 within the volatile memory 124.

Although particular data format(s) for entries 142 of the sequencer configuration data 142 are described herein, the disclosure is not limited in this regard and could be adapted to represent MC timing and/or signal vector information using any suitable data structure having any suitable format and/or layout. For example, in some embodiments, the entries 142 of the sequencer configuration data 140 may comprise differently sized data units, such as 16-bit quantities, 64-bit quantities, variably-sized data units, and/or the like. Alternatively, or in addition, the entries 142 may comprise commands and/or instructions configured for execution by the sequencer 122. The entries 142 may correspond to a command and/or instruction set supported by the sequencer 122. In some embodiments, the entries 142 may comprise sequencer state data, which may be used to configure the sequencer 122 to transition to a particular state (e.g., output a determined set of MC signals for a specified period of time before transitioning to a next state).

Memory operations implemented by the sequencer 122 may comprise one or more characteristics, which may include, but are not limited to: an operation type (e.g., "op code"), an address, flags, parameters, and/or the like. The operation type 118 may indicate the type of memory operation being performed (e.g., read, program, erase, etc.). The address may indicate the NV memory elements 112 on which the memory is to be performed. Characteristics of memory commands and/or operations may be decoded and/or otherwise defined by functional modules 130 of the control circuitry 120, such as command decoder circuitry, address decoder circuitry, and/or the like (not shown in FIG. 1C to avoid obscuring details of the illustrated embodiments). FIG. 1C depicts a memory operation 108 for execution at the sequencer 122, which may have a particular operation type 118. The operation type 118 may correspond to one of a plurality of different operation types 118A-N capable of being implemented by the sequencer 122, which may include, but are not limited to: program operations, storage operations, write operations, read operations, read before write operations, erase operations, reset operations, verify operations, grooming operations, garbage collection operations, and/or the like.

As disclosed above, the sequencer 122 may be configured to manage the execution of respective memory operations within the NV memory 104 by, inter alia, generating a sequence of MC signal vectors 123 corresponding to the respective operations. The MC signal vectors 123 generated by the sequencer 122 may configure functional modules 130 of the control circuitry 120 to implement respective memory operations within the NV memory 104. Each different type of memory operation may require the sequencer 122 to produce a different respective sequence or MC signal vectors 123 having different respective configuration(s), timing(s), and/or duration(s).

In the FIG. 1C embodiment, the sequencer 122 may be configured to map operation type(s) 118A-N to respective portions of the sequencer configuration data 140. As disclosed herein, the sequencer configuration data 140 may comprise a plurality of entries 142, which may be arranged according to a determined order. The sequencer 122 may execute memory operations by, inter alia, accessing and/or executing entries 142 in sequence. Executing a sequence of the entries 142 may configure the sequencer 122 to generate an MC sequence 126 corresponding to a particular operation type 118A-N (e.g., output an appropriate sequence of MC signal vectors 123). In the FIG. 1C embodiment, the sequencer configuration data 140 comprises a plurality of entry sequences 144, each entry sequence 144 comprising one or more entries 142 configured for execution in a determined order (e.g., each entry sequence 144 comprising a respective ordered sequence of entries 142). The entries 142 of the respective entry sequences 144 may be arranged within respective sequential address ranges and/or offsets within the volatile memory 124. In the FIG. 1C embodiment, the entry sequence 144A may comprise entries 142 stored at address 146A through 148A; the entry sequence 144B may comprise entries 142 stored at address 146B through 148B; and so on, with the entry sequence 144N comprising entries 142 stored at address 146N through 148N. Each entry sequence 144A-N may correspond to a respective operation type 118A-N. For example, the entry sequence 144A may be associated with operation type 118A, such that the sequence of entries 142 comprising the entry sequence 144A are configured to cause the sequencer 122 to generate an MC sequence 126 for executing memory operations of operation type 118A. The entry sequence 144B may be associated with operation type 118B, and so on, with entry sequence 144N being associated with operation type 118N.

The sequencer 122 may comprise a fetch unit 152, which may be configured to fetch entries 142 from the volatile memory 124 via the bus 121. The fetch unit 152 may comprise a fetch circuit, fetch circuitry, fetch logic, and/or the like, which may be embodied within the NV memory structure 110, as disclosed herein. In response to the memory operation 108, the fetch unit 152 may be configured to fetch a selected entry 142 from the volatile memory 124. The fetch unit 152 may select the entry 142 to fetch based on, inter alia, one or more characteristics of the memory operation 108. In the FIG. 1C embodiment, the fetch unit 152 may be configured to select the entry 142 to fetch from the volatile memory 124 based on the operation type 118 of the memory operation 108. The fetch unit 152 may select the entry 142 by use of a set of associations 153, which may map each operation type 118A-N to a respective entry sequence 144A-N (and/or respective entry addresses, such as an address 146A-N of the first entry 142 of each entry sequence 144A-N). The associations 153 may be defined by the sequencer configuration data 140 (e.g., the associations 153 may be stored at a determined address and/or address offset within the volatile memory 124), and may be accessed by the fetch unit 152 during operation of the memory system 101. The associations 153 may be maintained in a data structure, such as a table, look-up table, index, tree, map, and/or the like. Although particular mechanisms for associating memory commands and/or operations with sequencer configuration data 140 are described herein, the disclosure is not limited in this regard and could be adapted to map, translate and/or otherwise associate memory commands and/or operations with sequencer data 140 using any suitable technique, mechanism, and/or data structure(s).

In the FIG. 1C embodiment, the fetch unit 152 may associate the memory operation 108 with entry sequence 144A and/or address 146A based on the operation type 118 of the memory operation 108. In response, the fetch unit 152 may fetch the entry 142 at address 146A (the first entry of the entry sequence 144A). The fetch unit 152 may be further configured to set an address pointer 125 to the address 146A. The fetch unit 152 may read the entry 142 from the determined address 146A and provide the entry 142 to a decode unit 154 of the sequencer 122.

The decode unit 154 may comprise a decode circuit, decode circuitry, decode logic, and/or the like (which may be embodied within the NV memory structure 110, as disclosed herein. The decode unit 154 may be configured to identify, extract, and/or interpret respective portions of the entry 142. In response to receiving the entry 142 from the fetch unit 152, the decode unit 154 may be configured to identify the signal data 143 and/or timing data 145 of the entry 142. The decode unit 154 may be configured to identify and/or extract the signal data 143 and/or timing data 145 in accordance with the determined format and/or layout of the entry 142, as disclosed herein (e.g., the signal data 143 may correspond to data bits [19:0] and the timing data 145 may correspond to data bits [31:20]). The decode unit 154 may be further configured to determine timing information for the entry 142, which may comprise extracting an exponent 147 and/or mantissa 149 from the entry 142 (e.g., from data bits [31:28] and [27:20], respectively). The decode unit 154 may be further configured to multiply the mantissa 149 by the exponent 147, as disclosed herein. The calculation may be simplified as compared to a typical arithmetic operation since, inter alia, the multiplication may comprise a bitwise shift of the mantissa 149 by the exponent 147 (since the exponent represents respective powers of two, which correspond to bitwise shifts of an unsigned integer).

The decode unit 154 may provide the signal data 143 and determined timing information 165 (e.g., number of clock cycles) to an execution unit 156 of the sequencer 122. The execution unit 156 may comprise an execution circuit, execution circuitry, execution logic, output circuitry, driver circuitry, buffer circuitry, and/or the like, which may be embodied within the NV memory structure 110, as disclosed herein. The execution unit 156 may be configured to generate an MC signal vector 123 in accordance with the signal data 143 of the entry 142, as disclosed herein. The execution unit 156 may comprise MC driver circuitry 158, which may be configured to generate one or more MC signals comprising the MC signal vector 123 in accordance with the provided signal data 143. The MC driver circuitry 158 may comprise one or more signal drivers, signal buffers, amplifiers, charge pumps, and/or the like. The MC driver circuitry 158 may be coupled to means for communicating the MC signals comprising the MC signal vector 123 to the control circuitry 120 (and/or the respective functional modules 130 thereof). The means for communicating the MC signals may include one or more: conductors, channels, wires, traces, vias, through silicon vias (TSV), switches, routers, interconnects, busses, and/or the like.

The execution unit 156 may be further configured to output an MC signal vector 123 in accordance with the timing information 165 provided by the decode unit 154 (e.g. for the duration specified by the timing information 165). The timing information 165 may comprise a clock cycle count, as disclosed herein. The execution unit 156 may comprise a counter unit 157, which may be configured to count cycles of a clock signal in order to, inter alia, maintain the MC signal vector 123 in the state defined by the signal data 145 for a specified number of clock cycles (not shown in FIG. 1C to avoid obscuring details of the illustrated embodiments). In response to determining that the MC signal vector 123 has been generated for the specified number of clock cycles, the execution unit 156 may determine that the entry 142 is complete. In response to the completion, the execution unit 156 may output an MC signal vector 123 corresponding to a next entry 142 (in accordance with signal data 145 and/or timing information 165 provided by the decode unit 154). The execution unit 156 may be further configured to notify other units 152, 154, and/or 158 that execution is complete.

In response to fetching the entry 142 (the first entry 142), the fetch unit 152 may begin fetching a next entry 142. In some embodiments, the fetch unit 152 begins fetching the next entry 142 before execution of the first entry 142 is complete, such that the next entry 142 is fetched for processing as soon as other units 154, 156, and/or 158 complete execution of the first entry 142. Alternatively, the fetch unit 152 may delay fetching until receiving status information from one or more other units 154, 156, and/or 158, such as a completion notification from the execution unit 156 and/or decode information from the decode unit 154. Fetching the next entry 142 may comprise incrementing the address pointer 125 according to a determined ordering of the entries 142 in the volatile memory 124. The fetch unit 152 may load the next entry 142 from the volatile memory 124 and/or provide the next entry 142 to the decode unit 154, as disclosed herein. In some embodiments, the fetch unit 152 is configured to provide the next entry 142 to the decode unit 154 (and/or notify the decode unit 154 that the next entry 142 is available for processing) prior to completion of the first entry 142. In response, the decode unit 154 may decode the next entry 142 and provide the corresponding signal data 143 and/or timing information 165 to the execution unit 156, which may generate the MC signal vector 123 corresponding to the provided signal data 143 for the specified time duration in response to completing the first entry 142. The decode unit 154 may decode the next entry 142 and/or provide the corresponding signal data 143 and/or timing information 165 to the execution unit 156 prior to completion of the first entry 142 by the execution unit 156, such that the signal data 143 and/or timing information 165 is available at the execution unit 156 at (or before) execution of the first entry 142 is completed.

The sequencer 122 may process subsequent entries 142 in sequence, as disclosed herein. The sequencer 122 may continue processing entries 142 until determining that the memory operation 108 (and/or corresponding entry sequence 144A) is complete. In some embodiments, the sequencer 122 detects completion based on a completion condition. As used herein, a completion condition refers to any condition, criterion, trigger, threshold, and/or interrupt capable of being detected by the sequencer 122. In some embodiments, the completion condition may comprise fetching a special-purpose entry 142 from the volatile memory 124. The special-purpose entry 142 may indicate that the entry sequence 144 being implemented by the sequencer 122 is complete. The special-purpose entry 42 may be detected based on, inter alia, an address associated with the special-purpose entry 142, signal data 143 of the special-purpose entry 142, timing data 145 of the special-purpose entry 142, and/or the like. In some embodiments, the special-purpose entry 142 may comprise a NOOP, idle, or "halt" entry 142, which may specify a 0 time duration (e.g., comprise 0 and/or null timing data 145) and/or comprise a designated signal data 143 (e.g., 0 or null signal data 143). Alternatively, or in addition, the completion condition may comprise fetching an invalid and/or null entry 142 from the volatile memory 124 and/or incrementing the address pointer 125 to an invalid address (e.g., an address outside an address range of the volatile memory 124 and/or outside a memory region used for storage of the sequencer configuration data 140). In some embodiments, the completion condition may comprise reaching a last address of the entry sequence 144 (e.g., address 148A for entry sequence 144A). The last address 148 of each entry sequence 144 may be included in the associations 153 disclosed above. In some embodiments, the completion condition may comprise executing a threshold number of entries 142 (e.g., the associations 153 may indicate the number of entries 142 included in respective entry sequences 144).

In response to determining that execution of the memory operation 108 (and/or entry sequence 144A) is complete, the sequencer 122 may terminate the sequential execution of entries 142 and/or begin execution of a next memory operation. The sequencer 122 may be configured to jump to a different address within the volatile memory 124, and resume accessing and/or executing entries 142, as disclosed herein. Alternatively, or in addition, the sequencer 122 may be configured to output a default MC signal vector 123, until a next memory operation is performed. As disclosed herein, the default MC signal vector 123 may be configured to idle one or more functional modules 130 of the control circuitry 120 to thereby reduce the power consumption and/or heat generated by the control circuitry 120. The sequencer 122 may continue outputting the default MC signal vector 123 until interrupted (e.g., until execution of a next memory operation).

As disclosed above, one or more of the entries 142 may comprise special-purpose entries. As used herein, a special-purpose entry 142 refers to an entry that configures the sequencer 122 to implement one or more control and/or management operations pertaining to the sequencer configuration data 140. A special-purpose entry 142 may comprise a NOOP entry 142, halt entry 142, and/or idle entry 142, which, as disclosed above, may configure the sequencer 122 to output a NOOP or idle MC signal vector 123 configured to idle one or more functional units 130 of the control circuitry 120 and/or terminate the sequential execution of entries 142 within the memory. Another special purpose entry 142 (e.g., a jump entry 142) may configure the sequencer 142 to access a next entry 142 from a designated address, which may differ from the next address in the sequence being executed by the sequencer 122. The decode unit 154 may be configured to detect a jump entry 142 (based on the signal and/or timing data 143,145 thereof) and may configure the fetch unit to fetch a next entry 142 from an address specified by the jump entry 142, which may comprise updating the address pointer 125 to the specified address. Another special-purpose entry may comprise a conditional jump entry 142. A conditional jump entry 142 may configure the sequencer 122 to jump to a specified address if a condition specified by the conditional jump entry 142 is satisfied. The condition may pertain to one or more status signals and/or indicators of the control circuitry 120, such as a program verify signal of read/write circuitry (disclosed in further detail herein). The decode unit 154 may detect a conditional jump entry 142 based on the contents thereof. The decode unit 154 may be further configured to decode a condition specified by the conditional jump entry and/or evaluate the decoded condition. Evaluating the condition may comprise reading one or more status signals and/or indicators, as disclosed herein. The decode unit 154 may be further configured to provide the address specified by the conditional jump entry 142 to the fetch unit 152 in response to the evaluation indicating that the condition is satisfied. Otherwise, the decode unit 154 may ignore the conditional jump entry 142, such that the fetch unit 152 (and/or other units 154, 156, 158) continue the sequential execution of entries 142, as disclosed herein. The decode unit 154 may not forward the conditional jump entry 142 to the execution unit 156.

Although particular types of special-purpose entries 142 are described herein, the disclosure is not limited in this regard, and could be adapted to use any type of entry 142 and/or special-purpose entry 142 having any suitable format and/or configured to implement any suitable type of control and/or management operation pertaining to the sequencer 122 and/or sequencer configuration data 140. In some embodiments, the sequencer may comprise a processor, microcontroller, and/or the like, which may be configured to execute a particular instruction set. In such embodiments, the entries 142 of the sequencer data 140 may comprise instructions of the particular instruction set. The particular instruction set may include instructions to configure the sequencer 122 to produce respective sequences of MC signal vector(s) 123 having a defined configuration, timing, and/or duration, as disclosed above. The particular instruction set may further include instructions pertaining to other operations, such as NOOP instructions, stop instructions, halt instructions, idle instructions, jump instructions, conditional jump instructions, arithmetic instructions (e.g., compare instructions), status instructions, and so on.

FIG. 1D is a schematic block diagram illustrating another embodiment of a sequencer 122 as disclosed herein. In the FIG. 1D embodiment the sequencer 122 may comprise state machine circuitry, such as a finite-state machine circuit, finite-state automation circuit, finite state logic, and/or the like. Respective states and/or state transitions of the state machine circuitry comprising the sequencer 122 may be defined by, inter alia, the sequencer configuration data 140 disclosed herein. In the FIG. 1D embodiment, the sequencer comprises state logic 166, next state logic 164, and output logic 168. The sequencer 122 may further comprise fetch logic 162, which may be configured to load entries 142 of the sequencer configuration data 140 from the memory unit 129, as disclosed herein. In the FIG. 1D embodiment, the fetch logic 162 is configured to load entries 142 from the non-transitory storage 106. As such, the NV memory structure 110 (and/or memory system 101) may not include the volatile memory 124 of FIG. 1A. The sequencer 122 and the non-transitory storage 106 may be embodied within the NV memory structure 110 and/or memory system 101, as disclosed herein.

The fetch logic 162 may provide the entries 142 loaded from the non-transitory storage 160 to the next state logic 164, which may determine a next state for the sequencer 122 therefrom. The state logic 166 may be configured to maintain a current state of the sequencer 122. As disclosed herein, the "state" of the sequencer 122 refers to the set of MC signals to be output by the sequencer 122 and/or a duration for the set of MC signals (e.g., number of clock cycles). The state of the sequencer 122 may, therefore, be defined by the signal data 143 and/or timing data 145 of an entry 142. In response to an entry 142, the next state logic 164 may determine the next state for the sequencer 122 by decoding, parsing, and/or extracting signal and/or timing data 143,145 from the entry 142, calculating timing information 165 for the entry 142, and so on, as disclosed herein. The next state logic 164 may be further configured to provide the next state information to the state logic 166. The state logic 166 may comprise one or more registers, latches, memory buffers and/or the like. The next state logic 164 may further comprise a counter 157, which may increment in response to a clock signal (e.g., CLK). The next state logic 164 may transition the state logic 166 to a next state by, inter alia, latching signal data 143 and/or timing information 165 of a next entry 142 into the state logic 164, resetting the counter 157, and so on. The output logic 168 may be configured to generate an MC signal vector 123 comprising MC signal(s) corresponding to the signal data 143 maintained by the state logic 166. The output logic 168 may comprise circuitry configured to decode and/or otherwise convert the signal data 143 into respective MC signal(s), drive the MC signal(s) comprising the MC signal vector 123, route the MC signal(s) to control circuitry 120 within the NV memory 104, and so on, as disclosed herein.

The state logic 166 may maintain the state information latched therein until the counter 157 reaches a determined value (e.g., the number of clock cycles specified by the timing information 165). Until the counter 157 reaches the determined value, the output logic 168 may continue generating the MC signal vector 123 corresponding to the signal data 143 latched therein. Accordingly, the output logic 168 may maintain the MC signal vector 123 in the state defined by the signal data 143 for the duration specified by the timing data 145 of the entry 142. When the counter 157 reaches the determined value, the state logic 166 may transition to a next state, which may comprise latching state information provided by the next state logic 164 (e.g., latching signal data 143 and timing information 165 corresponding to a next entry 142 loaded by the fetch logic 162). Transitioning to the next state may comprise the output logic 168 generating a different MC signal vector 123 in accordance with the different signal data 143 latched within the state logic 166.

Figure 1E:
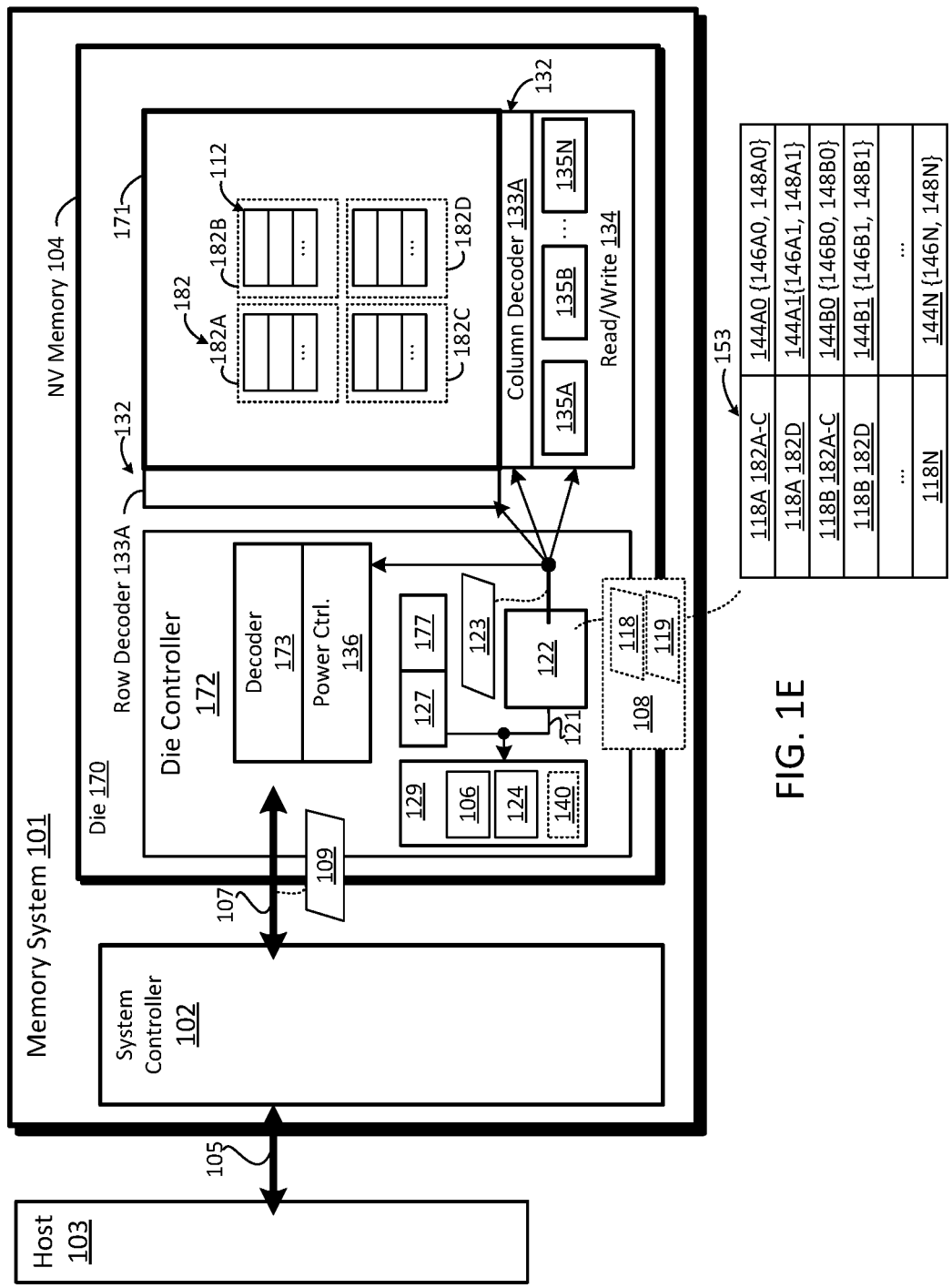
FIG. 1E is a schematic block diagram illustrating another embodiment of a memory system comprising a sequencer configured to adapt memory command, timing, and/or control signals, such as memory operation pulses.

FIG. 1E is a schematic block diagram depicting another embodiment of a memory system 101 configured to adapt memory operation pulses after design and/or fabrication of the memory system 101. The memory system 101 may comprise a system controller 102 and NV memory 104. The system controller 102 may be configured to communicatively couple the memory system 101 to a host 103. The host 103 may comprise a computing device, which may include, but is not limited to: a server computing device, a personal computing device, a mobile computing device (e.g., a smartphone, a tablet, or the like), an embedded computing device, a virtual computing system (e.g., a virtual machine, a virtual desktop), a virtualization environment (e.g., a virtualization kernel, a hypervisor), and/or the like. Although not shown in FIG. 1E to avoid obscuring details of the illustrated embodiments, the host 103 may comprise a processor, volatile memory, non-transitory storage, one or more input/output interface(s), human-machine interface (HMI) components, and/or the like.

In some embodiments, the memory system 101 is embedded within the host 103 and/or comprises an internal component of the host 103. The memory system 101 may comprise an on-board memory device, on-board storage device, integrated memory device, integrated storage device, a memory module, a storage module, and/or the like. Alternatively, or in addition, the memory system 101 may be configured to be selectively coupled to the host 103 through one or more of a host interconnect, an on-board interconnect, a system interconnect, an external interconnect, a remote interconnect, and/or the like (e.g., interconnect 105). The memory system 101 may comprise an add-on device, an add-on storage device, an add-on memory device, a peripheral device, a peripheral component device, and/or the like. In some embodiments, memory system 101 is embodied within a device that is separate from and/or independent of the host 103 (and/or is capable of being selectively coupled and/or decoupled from the host 103). The memory system 101 may comprise a memory device, a storage device, an external memory device, an external storage device, a memory appliance, a storage appliance, a server, a memory server, a storage server, a network-attached memory device, a network-attached storage device, a cache device, a cache appliance, and/or the like. Although FIG. 1A depicts a single host 103, the disclosure is not limited in this regard. The memory system 101 could be communicatively coupled to any number of hosts 103 (e.g., may be shared between a plurality of hosts 103).

The memory system 101 may be communicatively coupled to the host 103 through the interconnect 105. The interconnect 105 may include, but is not limited to, an input/output (I/O) connect, and I/O bus, an I/O controller, a local bus, a host bridge (Northbridge, Southbridge, or the like), a front-side bus, a peripheral component interconnect (PCI), a PCI express (PCI-e) bus, a Serial AT Attachment (serial ATA or SATA) bus, a parallel ATA (PATA) bus, a Small Computer System Interface (SCSI) bus, a Direct Memory Access (DMA) interface, an IEEE 1394 (FireWire) interface, a Fiber Channel interface, a Universal Serial Bus (USB) connection, and/or the like. In some embodiments, the memory system 101 is communicatively coupled to the host 103 through an electronic communication network. The interconnect 105 may, therefore, comprise one or more of: a network, a network connection, a network interface, a storage network interface, a Storage Area Network (SAN) interface, a Virtual Storage Area Network (VSAN) interface, a remote bus, a PCE-e bus, an Infiniband interface, a Fibre Channel Protocol (FCP) interface, a HyperSCSI interface, a remove DMA (RDMA) interface, and/or the like.

The system controller 102 may be configured to manage data transfers to and/or from the memory system 101. The system controller 102 may comprise an I/O controller, an I/O buffer, a read buffer, a write buffer, a DMA controller, an RDMA controller, and/or the like. The system controller 102 may be configured to communicate data stored within the memory system 101 on the interconnect 105, which may include, but is not limited to: data read from the memory system 101, status information pertaining to the memory system 101, configuration information pertaining to the memory system 101, and so on. The system controller 102 may be further configured to receive data from the interconnect 105, which may include commands, data, configuration information, firmware, and/or the like.

The NV memory 104 may comprise a die 170. The die 170 may comprise and/or embody an NV memory array 171 and control circuitry, which may comprise a die controller 172, sequencer 122, address circuitry 132, read/write circuitry 134, power control circuitry 136, and so on. The address circuitry 132, read/write circuitry 134, and power control circuitry 136, may comprise functional modules 130, which may be configured to implement memory operations within the NV memory array 171 in response to MC signal vectors 123 generated by the sequencer 122, as disclosed herein.

As illustrated in FIG. 1E, the die controller 172 and/or other control circuitry 132, 134, 136, and/or 122 may be implemented on and/or embodied within the die 170 comprising the NV memory array 171. Therefore, the die controller 172 and sequencer 122 may comprise "on-die" or "on-chip" control circuitry of the NV memory 104. Although FIG. 1E depicts a memory system 101 comprising a single NV memory 104 having a single die 170, the disclosure is not limited in this regard and encompasses embodiments that include any number of NV memories 104 and/or die 170 (e.g., four, eight, or more die 170), each comprising respective NV memory array 171 and corresponding control circuitry.

The sequencer 122 may be configured to control the execution of memory operations based on sequencer configuration data 140 stored within a memory unit 129. The memory unit 129 may comprise one or more of a non-transitory storage 106 and volatile memory 124, as disclosed herein. In the FIG. 1E embodiment, the volatile memory 124 may be embodied within the die 170 (within the same die 170 as the sequencer 122 and/or NV memory array 171). The volatile memory 124 may comprise an SRAM unit, DRAM unit, and/or the like. The volatile memory 124 may be populated with sequencer configuration data 140 from non-transitory storage 106, as disclosed herein (by use of the configuration manager 127). In the FIG. 1E embodiment, memory unit 129, including the non-transitory storage 106 and/or volatile memory 124, may be embodied within the die 170 (within the same die 170 as the sequencer 122 and/or NV memory array 171). Alternatively, the memory unit 129, non-transitory storage 106, and/or volatile memory 124 may be embodied within structures other than the die 170 (e.g., may comprise separate die, chips, packages, and/or the like).

The die 170 may comprise any suitable type of NV memory elements 112 in any suitable arrangement and/or configuration. The NV memory array 171 may comprise non-transitory memory, solid-state memory, Flash memory, NAND-type Flash memory, NOR-type Flash memory, PMC memory, SONOS memory, RRAM, FJG RAM, FeRAM, MRAM, PRAM, EEPROM, and/or the like.

The system controller 102 may be configured to receive commands pertaining to the NV memory system 101 through the interconnect 105. Although not depicted in FIG. 1E to avoid obscuring the details of the illustrated embodiments, the system controller 102 may comprise one or more interface components configured to communicatively couple the controller 102 to the interconnect 105 and/or 107. The system controller 102 may be further configured to power the memory structure 110 by use of the interconnect 105 (e.g., the interconnect 105 may be configured to power device(s) coupled thereto). Alternatively, or in addition, the NV memory system 101 may be powered by use of a separate power source and/or connection. The commands received through the interconnect 105 may comprise commands to store data within the memory system 101, commands to read data from the memory system 101, management commands, commands pertaining to a configuration of the memory system 101, commands requesting status information pertaining to the memory system 101, commands to transfer data to and/or from the memory system 101, and/or the like. The system controller 102 may be configured to execute the commands, which may comprise decoding the commands and/or issuing corresponding commands 109 to the NV memory 104 (via the interconnect 107).

The die controller 172 may be configured to implement memory operations in response to respective commands 109, as disclosed herein. The die controller 172 may be further configured to execute management operations on the NV memory 104, which may be independent of commands 109. Such management operations may comprise refresh operations, grooming operations, garbage collection operations, and/or the like, as disclosed herein. The execution of memory operations may be controlled by the sequencer 122, which may generate MC sequence vector(s) 123 adapted to configure functional modules (e.g., address circuitry 132, read/write circuitry 134, power control circuitry 136, and so on) to execute the respective memory operations.

The die controller 172 may comprise decode circuitry 173, which may be configured to process memory commands 109 received via the interconnect 107. The decode circuitry 173 may be configured to determine the operation type(s) corresponding respective commands 109, determine addressing information pertaining to the commands 109, and so on. The decode circuitry 173 may be further configured to convert and/or translate addresses of memory commands 109 to addresses usable by the address circuitry 132 to address respective NV memory elements 112 within the NV memory array 171 (by use of column decoder 133A and/or row decoder 133B).

The address circuitry 132 may be configured to address NV memory elements 112 corresponding to particular memory operations. The address module 132 may comprise a row decoder 133A and a column decoder 133B. NV memory elements 112 of the NV memory array 171 may be addressable by respective memory array control lines via the row decoder 133A and/or column decoder 133B. The memory array control lines may include word lines, which may be accessible through the row decoder 133A, and bit lines, which may be accessible through the column decoder 133B.

The read/write circuitry 134 may be configured to execute memory operations on NV memory elements 112 addressed by the address circuitry 132 by use of one or more sense blocks 135A-N, such as reading data from the addressed NV memory elements 112, writing data to the addressed NV memory elements 112, erasing the addressed NV memory elements 112, and/or the like. The power control circuitry 136 may be configured to control the power and/or voltage potentials supplied to memory array control lines during Memory operations (e.g., word lines, bit lines, select lines, and/or the like) The power control circuitry 136 may comprise one or more charge pumps, signal drivers, signal amplifiers, and/or the like. The configuration timing, and/or duration of voltage potentials and/or other signals used by the address circuitry 132, read/write circuitry 134, and/or power control circuitry 136 to implement respective memory operations may be controlled, at least in part, by MC signal vector(s) 123 generated by the sequencer 122.

In one embodiment, the NV memory cells and/or NV memory elements 112 comprising the NV memory array 171 may be arranged into respective blocks. A block may correspond to a unit of erase (e.g., may contain NV memory cells and/or NV memory elements 112 configured to be erased as group). As disclosed in further detail herein, each block may comprise a set of NAND strings, which may be accessed via respective memory array control lines word lines, bit lines, select lines, etc.) the NAND strings within each block may share a common set of word lines. Each block may comprise a plurality of pages (NAND pages), which may correspond to units of programming. A NAND page may comprise a row of NV memory cells within the NV memory array 171. A NAND page may comprise a set of NV memory cells that are coupled to a same word line and are capable of being programmed in parallel. The NV memory elements 112 depicted in FIG. 1E may comprise and/or correspond to pages, blocks, groups of pages, groups of blocks, and/or the like.

NV memory elements 112 and/or collections of NV memory elements 112 (e.g., NV memory elements 112 within particular blocks and/or collections of blocks) may be classified into one or more physical zones 182 (e.g., physical zones 182A-D). As used herein, a physical zone 182 refers to a collection of NV memory pages 112 having similar and/or corresponding characteristics, such as wear characteristics, performance characteristics, reliability characteristics, fabrication characteristics, and/or the like.

Figure 1F:
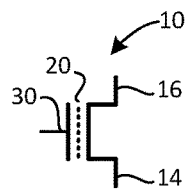
FIG. 1F is a schematic block diagram illustrating one embodiment of a NV memory cell.

In some embodiments, the NV memory array 171 may comprise a plurality of NV memory cells 10, as illustrated in FIG. 1F. An NV memory cell 10 may comprise a field-effect transistor having a charge storage unit 20, which may include, but is not limited to: a floating gate, charge trapping (dielectric) layer, and/or the like. The NV memory cell 10 may further comprise a source 14, a drain 16, and a control gate 30. The control gate 30 may be used to control read and write operations on the NV memory cell 10.

Figure 1G:
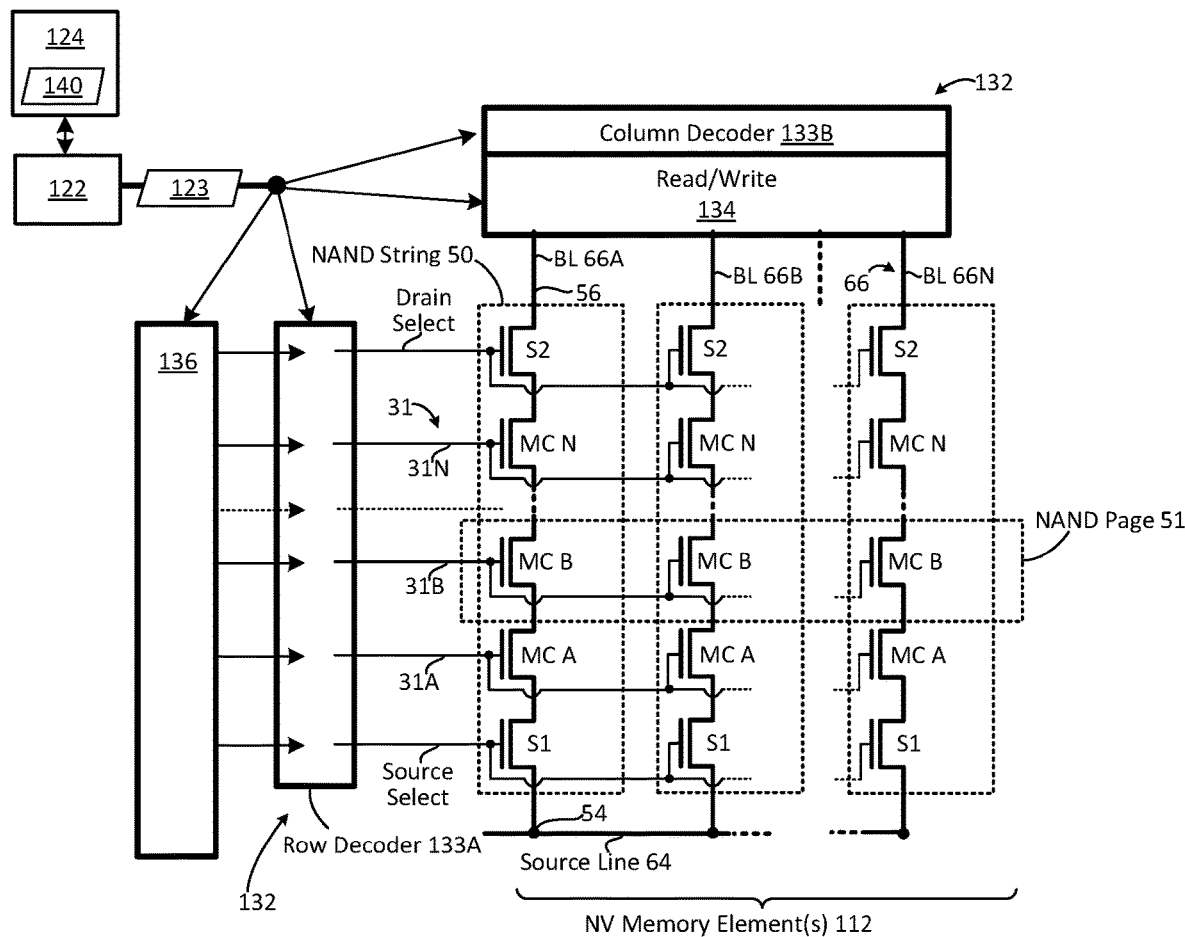
FIG. 1G is a schematic block diagram illustrating embodiments of control circuitry configured to implement memory operations in accordance with command, timing, and/or control signals corresponding to sequencer control data.

FIG. 1G depicts embodiments of NV memory element(s) 112 of the NV memory array 171 and corresponding functional units configured to implement memory operations on the NV memory elements 112 in response to MC signal vectors 123 generated by the sequencer 122. The NV memory elements 112 may comprise a plurality of NV memory cells 10 arranged within respective NAND strings 50 and/or NAND pages 51. Each NAND string 50 may comprise a series of NV memory cells 10 (MC A-N) daisy-chained by the sources 14 and drains 16 thereof. A pair of select transistors S1, S2 may selectively couple a NAND string 50 to a source terminal 54 and drain terminal 56 (which may power and/or activate the NAND string 50). When the source select transistor S1 of a NAND string 50 is turned on, the NAND string 50 may be coupled to a source terminal 54 and/or source line 64. Similarly, when the drain select transistor S2 is turned on, the NAND string 50 may be coupled to the drain terminal 56 and/or bit line 66 of the NAND string 50 (each NAND string 50 having a respective bit line 66A-N). The control gates 30 of the NV memory cells 10 may be coupled to respective word lines 31 (e.g. word lines 31A-N). The word lines 31 may span the NAND strings 50 (e.g., be coupled to a respective NV memory cell 10 within each of a plurality of NAND strings 50). In the FIG. 1G embodiment, control gates 30 of the NV memory cells 10 along respective rows of the NAND strings 50 may be connected to a same word line 31, forming respective NAND pages 51. Control gates of the select transistors S1, S2 of the respective NAND strings 50 may provide for controlling access to the NAND strings 50 via the respective source terminals 54 and drain terminals 56, as disclosed above.

Reading a selected NV memory cell 10 within a NAND string 50 may comprise supplying the selected NV memory cell 10 an appropriate voltage potential (via the word line 31 coupled to the control gate 30 of the selected NV memory cell 10), while supplying other, non-addressed NV memory cells 10 of the NAND string 50 with different voltage potential(s) (via respective control gates 30), which may be configured to fully turn on the other, non-addressed NV memory cells 10. In this way, a conductive path is effectively created between: a) the source 14 of the addressed NV memory cell 10 and the source line 64, and b) the drain 16 of the addressed NV memory cell 10 and the drain line (bit line 66). The voltage potentials required to implement read and/or verify operations may be driven on the word lines 31A-N by the read/write circuitry 134 and/or power control circuitry 136. Reading the selected NV memory cell 10 may further comprise sensing a voltage potential and/or current on the bit line 66 coupled to the NV memory cell 10 and/or latching corresponding data values sensed on the bit line 66 (by use of the read/write circuitry 134). The configuration, timing, and/or duration of the MC signal vectors 123 generated by the sequencer 122 in accordance with the sequencer configuration data 140 may determine the timing of various read operations, such as the time for which the word lines 31A-N are charged before subsequent sense operations, and so on. The configuration, timing and/or duration of read and/or verify operations performed within the NV memory 104 may be modified after design and/or fabrication of the NV memory 104 (e.g., by modifying entries 142 and/or entry sequences 144 corresponding to the read and/or verify operations in the sequencer configuration data 140).

Programming a selected NV memory cell 10 within a NAND string 50 may comprise applying a program voltage potential to the control gate 30 of the selected NV memory cell 10 (via a corresponding word line 31) while the bit line 66 of the NAND string 50 is coupled to ground. The program voltage potential may be applied to the control gate 30 of the selected NV memory cell 10 as a series of pulses having respective amplitudes and/or durations. During programming, control gates 30 of other NV memory cells 10 of the NAND string 50 may be driven at different voltage potentials, such as an isolation voltage potential. The configuration, timing, and/or duration of the voltage signals driven on the word lines during programming operations may be controlled by the MC signal vector(s) 123 generated by the sequencer 123, as disclosed therein. Therefore, the timing, configuration, and/or duration of such programming signals may be modified after design and/or fabrication of the die 170 by, inter alia, modifying the sequencer configuration data 140 implemented by the sequencer 122 to execute such operations.

One or more entries 142 of the sequencer configuration data 140 may configure the sequencer 122 to generate MC signal vectors 123, which may be adapted to configure the power control circuitry 136 to produce programming pulses having a particular configuration, timing and/or duration (e.g., the duration of one or more of the programming pulses may correspond to a specified duration of one or more entries 142). Accordingly, the configuration, timing, and/or duration of the programming pulses (and/or other signals) used to program NV memory cells 10 may be adjusted, modified, and/or otherwise manipulated after design and/or fabrication of the NV memory 104 (e.g., may be changed by modifying the sequencer configuration data 140 within the memory unit 129).

The voltage potentials and/or other signals driven by the read/write circuitry 134, power control circuitry 136 in response to the MC signal vectors 123 may be routed to respective NV memory cells 10 by the address circuitry 132 (e.g., the address circuitry 132 may selectively couple addressed NV memory cells 10 to the read/write circuitry 134 and/or power control circuitry 136). The row decoder circuitry 133A may be configured to couple the power control circuitry 136 to respective word lines 31 of one or more NV memory cells 10 (and/or route signals and/or voltage potentials generated by the power control circuitry 136 to respective word lines 31). The column decoder circuitry 133B may be configured to couple read/write circuitry 134 to respective bit lines 66 (e.g., couple sense blocks 135A-N to respective bit lines 66). The address circuitry 132 may be configured to address respective NV memory cells 10 within particular NAND strings 50 and/or NAND pages 51 based on address information provided by the decoder 173. The address circuitry 132 may be controlled, at least in part, by MC signal vectors 123 generated by the sequencer 122 (and/or address information pertaining for the memory operations), as disclosed herein.

Figure 1H:
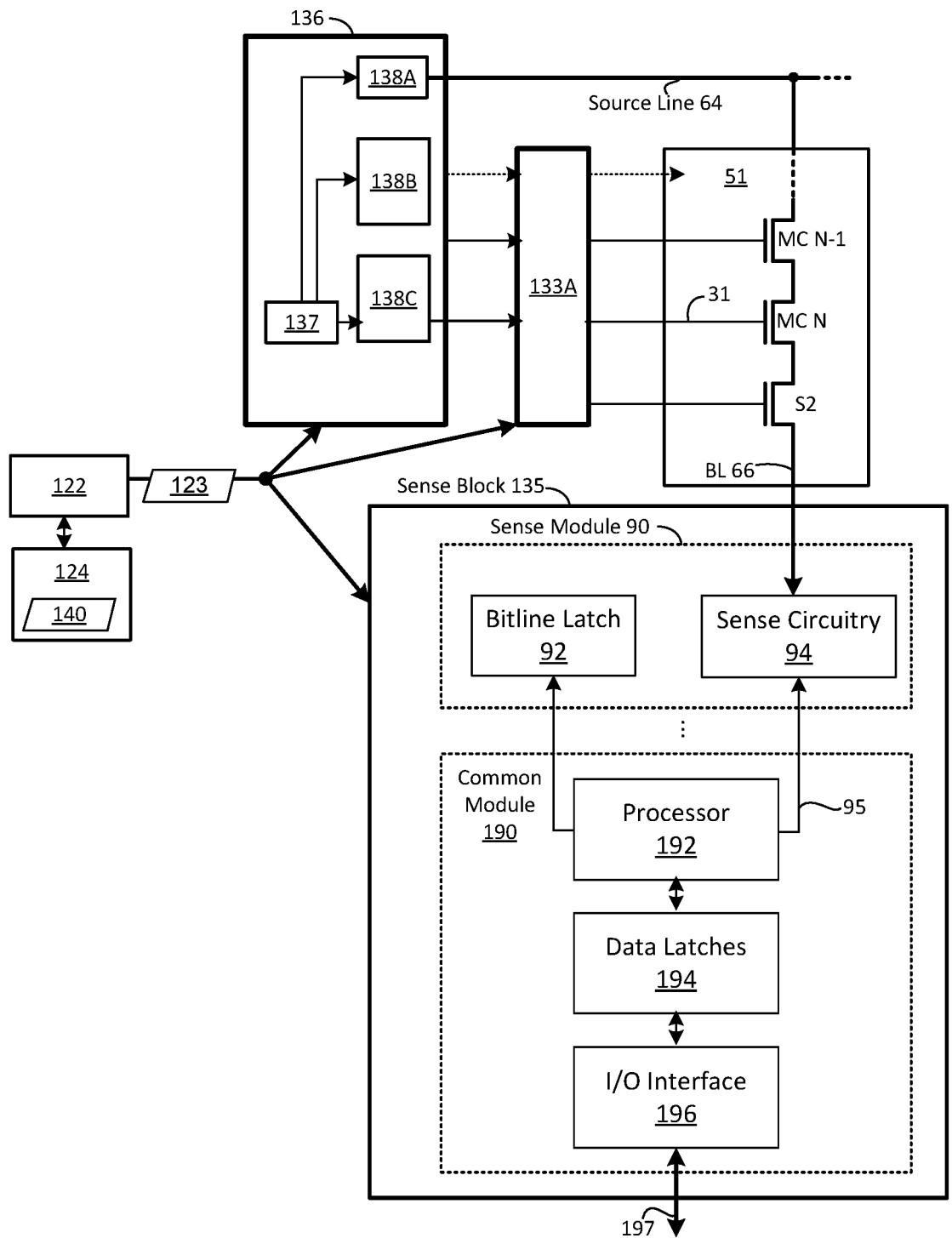
FIG. 1H is a schematic block diagram illustrating further embodiment of control circuitry configured to implement memory operations in accordance with command, timing, and/or control signals corresponding to sequencer control data.

FIG. 1H depicts further embodiments of control circuitry to execute memory operations within the NV memory array 171 in accordance with MC signal vectors 123 generated by the sequencer 122, as disclosed herein. FIG. 1H depicts one embodiment of a sense block 135, which may comprise a sense block 135A-N of the read/write circuitry 134 of FIGS. 1E and/or 1G.

The power control circuitry 136 may source and/or drain driver circuitry 138A, bias circuitry 138B, pulse generation circuitry 138C, and so on. The power control circuitry 136 may further charge pump circuitry 137, which may be configured to generate voltage potential(s) required by 138A, 138B, and/or 138C. The source and/or drain driver circuitry 138A may be configured to drive determined voltage potentials on source lines 64 of selected NAND strings 51 (and/or drive respective drain lines and/or well structures of the NAND strings 51). The bias circuitry 138B may be configured to bias respective word lines 31 of the NAND strings 51 at selected voltage potential(s), as disclosed herein. The pulse generation circuitry 138C may be configured to produce programming pulses on one or more word lines 31, as disclosed herein. The circuitry 137, 138A, 138B, 138C, may be controlled by, inter alia, MC signals of the MC signal vector 123 generated by the sequencer 122. The MC signal vector 123 may determine the configuration, timing, and/or duration of the voltage potentials, reference voltages, bias voltages programming pulses, and/or other memory control signals generated by the power control circuitry 136.

The sense block 135 may comprise a sense module 90, and a common module 190. In one embodiment, each bit line 66 may be coupled to a respective sense module 90. The common module 190 may be coupled to a plurality of sense modules 90. In one embodiment, a sense block 135 may comprise a common module 190 coupled to eight sense modules 90 (other sense modules 90 are not shown in FIG. 1H to avoid obscuring details of the illustrated embodiments). Each of the sense modules 90 may be coupled to the common portion via a data bus 95.

The sense module 90 may comprise sense circuitry 94 configured to determine whether a conduction current in a connected bit line 66 is above or below a predetermined threshold level (while word lines 31 coupled to NV memory cells 10 of the bit line 66 are driven at determined voltage levels by, inter cilia, the power control circuitry 136). The sense circuitry 94 may comprise one or more sense amplifier circuits, differential amplifier circuits, shunt circuits, and/or the like. The sense module 90 may further comprise a bit line latch 92, which may be used to set a voltage condition on the connected bit line. For example, a predetermined state latched in bit line latch 92 may result in the connected bit line 66 being pulled to a state corresponding to a program inhibit voltage (e.g., 1.5-3 V).

The common module 190 may comprise a processor 192, data latches 194, and an I/O interface 196. The I/O interface 196 may be coupled between the data latches 194 and a data, bus 197. Processor 192 may be configured to perform computations pertaining to respective sense operations. The processor 194 may be configured to determine the data stored in the NV memory cell 10 being sensed via the connected bit line 66 (by comparing a conduction current and/or voltage potential sensed on the connected bit line 66 to one or more thresholds) and/or store the determined data in the data latches 194. The data latches 194 may be configured to data, bits determined by processor 192 during a read operations and/or store data bits imported from the data bus 197. The imported data bits may comprise write data to be programmed to NV memory cell(s) 10 on the bit lines 66 coupled to respective sense modules 90.

During a sensing operation, the sequencer 122 may generate MC signal vector(s) 123, which may be adapted to configure the power control circuitry 136 to drive respective voltage potential(s) on selected word lines 31 coupled to NAND string 50 being sensed (e.g., the NAND string 50 corresponding to the bit line 66 coupled to the sense module 90). The configuration, timing, and/or duration of the voltage signals driven on the word lines 31 may be controlled by the MC signal vector 123 generated by the sequencer 122 (in, accordance with one or more entries 142 of the sequencer control data 140, as disclosed herein). The word lines 31 may be coupled to the power control circuitry 136 by use of the row decoder 133A of the address circuitry 132. Alternatively, or in addition, the row decoder 133A may be configured to route signals generated by the power control circuitry 136 to word lines 31 and/or control gates of the NAND string 50. The bit line 60 may be coupled to the sense module 90 by use of, inter alia, a column decoder 133B of the address circuitry 132 (not shown in FIG. 1H to avoid obscuring details of the illustrated embodiments).

During the read operation, the sequencer 122 may generate a sequence of MC signal vector(s) 123 (an MC sequence 126), which may configure the power control circuitry 136 to drive various control gate voltages corresponding to respective memory states supported by the NV memory cells 10. The various control gate voltages may be asserted for particular time durations in accordance with the timing(s) and/or duration(s) of the respective MC signal vector(s) 123 (as defined by the corresponding entries 142 of the sequencer configuration data 140). The MC signal vector(s) 123 may further configure the sense circuitry 94 (e.g., one or more sense amplifiers) to sense conduction current and/or a voltage potential on the bit line 66 during the read operation and/or latch corresponding data values within the bit line latch 92 and/or data latch 194. Sensing the bit line 66 may comprise comparing a sensed conduction current and/or voltage level on the bit line 66 to one or more thresholds and/or determining a binary encoding for a determined state of the NV memory cell 10 (by use of the processor 192). The sense operation may comprise sensing the bit line 66 in response to driving the word line 31 of the NV memory cell 10 at different voltage levels, each voltage level corresponding to a respective memory state (and while driving word lines of other NV memory cells 10 at voltage levels configured to cause such NV memory cells 10 to conduct).

As disclosed above, the MC signal vector(s) 123 generated by the sequencer 123 may determine timings for word line biasing, bit line sensing, and/or the like. Accordingly, the configuration, timing, and/or duration of the MC signal vector(s), and corresponding entries 142 of the sequencer configuration data 140) may determine timing(s) for sense operations within the NV memory array 171. By way of non-limiting example, the signal vector(s) 123 generated during a read operation may comprise a first MC signal vector 123 configured to cause the power control circuitry 136 to generate determined voltage potentials on respective word lines 31 coupled to the bit line 66. The duration of the first MC signal vector 123 is specified by the corresponding entry 142 of the sequencer configuration data 140. A second MC signal vector 123 may configure sense module 90 to sense a conduction current and/or voltage potential on the bit line 66 (While the power control circuitry 136 continues to bias the word lines per the first MC signal vector 123). The duration of the first MC signal vector 123 (as defined by the corresponding entry 142 of the sequencer configuration data 140) may, therefore, determine, inter alia, the bias timing(s) for the read operation (the amount of time allowed for driving the word lines 31 to the desired voltage potentials), a settling timing(s) for the read operation the amount of time allowed for the bit line to settle after the voltage potential(s) are driven on the word lines 31), and so on. In the foregoing example, the second MC signal vector 123 may have a specified duration, after which the sequencer may generate a third MC signal vector 123, which may deactivate the sense module 90 and/or configure the power control circuitry 136 to drive the word lines 31 to different voltage level(s) for a next sense operation. The duration of the second MC signal vector 123 (as determined by the corresponding entry 142 of the sequencer configuration data 140) may determine the time allocated for sensing the bit line 66 by the sense module 90.

The configuration, timing, and/or duration of other MC signal vectors 123 generated by the sequencer 122 may determine other aspects of read operations implemented within the NV memory array 171, as disclosed herein. The read operation timings, such as the bias timing(s), settle timing(s), sense timing(s), and/or the like, may be adjusted by, inter alia, modifying the sequence configuration data 140, as disclosed herein (e.g., by modifying the entries 142 corresponding to the respective word line bias operations, sense operations, and/or the like). Such modifications may be made during operation of the NV memory 104 and without re-designing and/or re-fabricating the sequencer 122 and/or die 170.

A programming operation may comprise applying a series of programming voltage pulses to the control gate 30 of the NV memory cell 10 being programmed. Each programming voltage pulse may be followed by a verify operation (a read-back and/or sense operation) to determine whether the NV memory cell 10 was successfully programmed to the desired memory state. The processor 192 may monitor the verify operation(s) to detect when the sequence of programming voltage pulses is complete (e.g., when the NV memory cell 10 is verified to be programmed to a target memory state).

Implementing a programming operation may comprise the sequencer 122 generating one or more MC signal vectors 123. The MC signal vectors 123 may configure the power control circuitry 136 to generate the series programming voltage pulses on the word line(s) of the NV memory cell(s) 10 being programmed. The MC signal vectors 123 may be further configured to cause the power control circuitry 136 to drive word lines of NV memory cell(s) 10 not being programmed to one or more determined voltage levels (e.g., a program inhibit voltage level). The MC signal vectors 123 may determine the configuration, timing, and/or duration of respective programming voltage pulses. The MC signal vectors 123 (and corresponding entries 142 of the sequencer configuration data 140) may determine the duration of the programming voltage pulses, the width of the programming voltage pulses, the time between respective programming voltage pulses and subsequent verify operations, and so on. Accordingly, the timing(s) for programming operations may be determined by the MC signal vectors 123 and corresponding sequencer configuration data 140 and may, therefore, be adjusted by modifying the sequencer configuration data 140, as disclosed herein.

The data latch stack 194 may comprise a stack of data latches corresponding to the sense module 90. In one embodiment, the data latch stack 194 comprises three data latches per sense module 90. The stack of data latches may be implemented as a shift register, such that parallel data stored therein is converted to serial data for communication to and/or from the data bus 197, and vice-versa. The data latches 194 of the sense block 135 may be linked to form a block shift register, which may enable a block of data to be input or output via serial transfer via the data bus 197.

In some embodiments, NAND strings 50 within respective blocks (e.g., erase blocks) may share a common well (e.g., a P-well). NV memory cells 10 of the respective blocks may be erased by raising the p-well to an erase voltage potential ('erase) for a determined period of time, while the word lines 31 coupled to the NV memory cells 10 are grounded and the source 64 and/or bit lines 66 are floating. The sequencer 122 may execute an erase operation by; inter alia, generating MC signal vectors 123 adapted to configure the address circuitry 132, read/write circuitry 134, and/or power control circuitry 136 to ground the word lines 31 of the block and to decouple the source lines 64 and/or bit lines 66 (such that the source lines 64 and/or bit lines 66 are floating). The MC signal vectors 123 may maintain the block in the configuration described above for a specified number of clock cycles, which may correspond to the erase time for the block (e.g., the time required to raise the voltage potential of the common well to Verase and/or maintain the common well at the Verase voltage level for the determined period of time). The configuration, timing(s) and/or duration(s) of the MC signal vectors 123 (and/or corresponding sequencer configuration data 142) may, therefore, determine erase timing(s) for erase operations implemented within the NV memory array 171. The erase timing(s) may be adjusted by, inter alia, modifying the sequencer configuration data 140 corresponding to the erase operations.

Referring back to FIG. 1E, in some embodiments, the memory system 101 may comprise a sequencer adjustment module 177. The sequencer adjustment module 177 may be a component of the configuration manager 127, which may be configured to manage the sequencer configuration data 140 stored within the memory unit 129 (e.g., non-transitory storage 106 and/or volatile memory 124). The sequencer adjustment module 177 may be configured to, inter alia, modify the sequencer configuration data 140 in response to usage conditions, wear levels, testing conditions, error rates, user preferences, commands, settings, parameters, and/or the like, as disclosed herein. In some embodiments, 177, the sequencer adjustment module 177 may be implemented within the NV memory 104 (e.g., on the die 107). Alternatively, the sequencer adjustment module 177 may be implemented by the system controller 102 and/or host 103.

The sequencer adjustment module 177 may be further configured to monitor memory operations being performed within the memory system 101 and/or adjust the sequencer configuration data 140 accordingly. In some embodiments, the sequencer adjustment module 177 may monitor wear levels of the NV memory 104. The sequencer adjustment module 177 may be configured to adjust the sequencer configuration data 140 to, inter alia, increase timing margins for various memory operations in response to increases in the wear level. Increasing timing margins may comprise, inter alia, modifying entries 142 corresponding to word line bias and/or sense operations in order to increase the time allowed for biasing and settling bit lines 66 prior to during sense operation(s), increasing the time allowed for sensing bit lines 66 (prior to transitioning to a next operation), and/or the like. Increasing timing margins may further comprise, inter alia, modifying entries 142 corresponding to programming voltage pulses used during program operations to, inter alia, increase the duration and/or amplitude of such pulses. Increasing timing margins may further comprise increasing the time allotted for erase operations (e.g., increasing the time that the common well of a block of NV memory cells 10 is maintained at an erase voltage potential (Verase). Alternatively, or in addition, the sequencer adjustment module 177 may be configured to reduce the duration of certain voltage signal in response to increasing wear level in order to, inter alia, reduce the effects of read and/or write disturb.

The sequencer adjustment module 177 may be further configured to modify the sequencer configuration data 140 in response to other conditions such as error rates for read and/or program operations. The sequencer adjustment module 177 may be configured to monitor memory operations and/or detect increases in error rate(s). Alternatively, or in addition, the sequencer adjustment module 177 may detect increased error rates in response to dedicated test operations (e.g., test operations implemented by a BIST module). In response to detecting increased read error rates, the sequencer adjustment module 177 may increase timing margins for read and/or sense memory operations, as disclosed herein. Detecting increased read error rates may comprise monitoring read operations and/or comparing a number and/or rate of read errors of the monitored read operations to one or more thresholds. The sequencer adjustment 177 may be further configured to modify the sequencer configuration data 140 in response to detecting increased write error rates (e.g., by monitoring write operations and/or comparing error rates of the monitored write operations to one or more thresholds). In response to increased write error rates, the sequencer adjustment module 177 may be configured to increase timing margins for write operations, as disclosed herein. Increasing the timing margins for memory operations, as disclosed herein, may comprise increasing the latency of such memory operations.

In another embodiment, the sequencer adjustment module 177 may be configured to adjust sequencer configuration data 140 for memory operations implemented on particular NV memory elements 112 and/or within particular physical zones 182. As disclosed above, a physical zone 182 may comprise NV memory elements 112 having similar physical characteristics. In one embodiment, a physical zone 182 (e.g., physical zone 182D) may correspond to a process corner within the NV memory 104. A "process corner" refers to circuitry having electrical characteristics that differ from circuitry of the NV memory 104. The differences in electrical characteristics may be due to, inter alia, variations during fabrication of the NV memory 104 (e.g., fabrication defects). The differences may not be substantial enough to render the NV memory elements 112 within the physical zone 182D unusable. However, the NV memory elements 112 of the physical zone 182D may exhibit reduced performance, decreased reliability, and/or higher error rates as compared to the NV memory elements 112 within other physical zones 182A-C.

In some embodiments, the sequencer configuration data 140 may be adapted to compensate for variations in various regions of the NV memory 104. In the FIG. 1E embodiment, the sequencer adjustment module 177 may be configured to detect differences between physical zone 182D and physical zones 182A-C and/or adjust the sequencer configuration data 140 to compensate for such differences. The sequencer adjustment module 177 may determine that the physical zone 182D comprises different characteristics in response to monitoring read and/or write operations implemented within the respective physical zones 182A-N (and/or corresponding error rates), as disclosed above. The sequencer adjustment module 177 may determine that the physical zone 182D is variant in response to detecting differences in the error rate(s) of memory operations implemented within physical zone 182D are compared to memory operations implemented within physical zones 182A-C and/or comparing such differences to one or more thresholds (e.g., in order to determine whether the differences are statistically significant). In response to detecting the variant physical zone 182D, the sequencer adjustment module 177 may be configured to generate one or more alternative entries 142 and/or entry sequences 144 for use within the variant physical zone 182D.

As illustrated in FIG. 1C, the sequence configuration data 140 may comprise a plurality of entry sequences 144A-N, each of which may correspond to a respective memory operation type (e.g. one of operation types 118A-N). In some embodiments, the sequence configuration data 140 may be further configured to include entry sequences 144 corresponding to different regions of the NV memory 104. The alternative entries 142 and/or entry sequences 144 may be created within sequencer configuration data 140 (e.g., as stored in the memory unit 129, volatile memory 124, and/or non-transitory storage 106). The alternative entries 142 and/or entry sequences 144 may correspond to MC signal vectors 123 having different configuration(s), timing(s), and/or duration(s) that the MC signal vectors of the original entries 142 and/or entry sequences 144, and may be configured to increase the timing margins for memory operations performed within the physical zone 182D, while maintaining the original timing margins for memory operations performed within other physical zones 182A-C.

As illustrated in FIG. 1E, the associations 153 for mapping a memory operation 108 to a particular entry 142 and/or entry sequence 144 may be configured to implement such mappings based on operation type 118 and address 119 (as opposed to operation type 118 alone as depicted in FIG. 1C). The associations 153 may associate map operations 108 of type 118A having an address 119 that corresponds to one of physical zones 182A-C to entry sequence 144A0 (having first entry address 146A0 and last entry address 148A0). The entry sequence 144A0 may correspond to the original entry sequence 144A for operations of type 118A. Memory operations of the same type 118A having an address corresponding to physical zone 182D may be mapped to a different entry sequence 144A1 having a different first entry address 146A1 and last entry address 148A1. Likewise, memory operations 108 of type 118B having an address 119 that corresponds to one or physical zones 182A-C may map to entry sequence 144B0, whereas the operations of the same type 118B that address physical zone 182D may map to an alternative entry sequence 144B1 As disclosed above, the entries 142 comprising the respective entry sequences 144A0, 144A1, and 144B0, 144B1 may differ. The entries 142 of sequences 144A1 and/or 144B1 may define relaxed timing(s) for the memory operations 108 in order to, inter alia, compensate for the different characteristics of the NV memory elements 112 within physical zone 182D (as compared to the characteristics of the NV memory elements 112 within physical zones 182A-C). Memory operations of type 118N may not be significantly affected by the differences between physical zone 182D and physical zones 182A-N and, as such, the associations 153 may map memory operations 108 of type 118N to the same entry sequence 144N regardless of the address(es) 119 of the memory operations 108.

Additional entry sequencer 144 may be added to the sequencer configuration data 140 after design and/or fabrication of the NV memory 140. The additional sequencer configuration 140 may correspond to new command and/or operation types 118 and/or may comprise alternative implementations of existing command and/or operations (e.g., alternative entries 142 and/or entry sequences 144, as disclosed above). In some embodiments, the sequencer adjustment module 177 (and/or other component) may be configured to generate sequencer configuration 140. The sequencer configuration data 140 may be generated from a timing specification, timing design, a timing waveform, and/or the like (referred to as an MC timing specification herein). Generating sequencer configuration data 140 may comprise identifying an ordered sequence of regions within the MC timing specification. Each region may correspond to a respective entry 142 of an entry sequence 144, as disclosed herein. Each region may correspond to a respective state of the MC signals (e.g., a respective MC signal vector 123), which may define signal data 143 for the corresponding entry 142. Each entry 142 may further comprise timing data 145, which may correspond to the duration of the region. The duration of each region may span from a respective start time to a respective end time. The start time of each region may correspond to the end time of a previous region in the sequence (or time 0 for a first region of the sequence). The regions may correspond to an ordered sequence, including a first region having a start time corresponding to a start time of the MC timing specification to a last region, which may correspond to a last clock cycle of the MC timing specification. The entries 142 corresponding to the regions may, therefore, comprise an entry sequence 144 (e.g., an ordered sequence of entries 142A-N, including a first entry 142A and/or last entry 142N). The first entry 142A of the sequence 144 may be defined by: a) recording a state of each MC signal of the MC timing specification in signal data 143 of the first entry 142A; and b) determining timing data 145 for the first entry 142A, which may comprise determining a duration of the region, as disclosed above (determining an end time of the region as the time at which any of the MC signals of the MC signal specification deviates from the determined signal data 143). Subsequent entries 142B-N may correspond to subsequent regions of the MC timing specification, and may be determined by: a) recording signal data 143 defining the state of each MC signal of the MC timing specification at a start time of the respective regions; and b) determining timing data 145 corresponding to the regions. The start time of the regions corresponding to entries 142B-N may correspond to the end time of previous entries 142A-(N-1) in the sequence, such that the start time for entry 142B corresponds to the end time of entry 142A, the start time of entry 142C corresponds to an end time of entry 142B, and so on, with the start time of entry 142N corresponding to an end time of entry 142N-1. The end time for each entry 142B-N may correspond to the time any one of the MC signals changes state following the start time, as disclosed above (the timing data 145 of each entry 142B-N may comprise a difference between the end time and start time of the corresponding region). Entries 142 may be iteratively added to the entry sequence 144 until a last entry 142N corresponding to a last clock cycle covered by the MC timing specification is defined.

The entries 142A-N (and/or entry sequence 144) generated from the MC timing specification may be transferred to the memory system 101, which may comprise storing the entries 142A-N (and/or entry sequence 144) in the memory unit 129 (e.g., non-transitory storage 106 and/or volatile memory 124 of the memory system 101, as disclosed herein). The entries 142A-N may correspond to particular memory commands and/or memory operations (e.g., particular operation types 118). Transferring the entries 142A-N and/or entry sequence 144 to the memory system 101 may further comprise modifying one or more of the associations 153 disclosed above to associate the particular operation types 118 with the entries 142A-N and/or entry sequence 144 (e.g., may map the particular operation types 118 to an address and/or address offset of one or more of the entries 142A-N stored within the memory unit 129). The operation type 118 may correspond to a new type of operation and/or command not previously supported by the sequencer 122. Transferring the entries 142A-N may further comprise associating the entries with one or more physical zones 182 and/or addresses, as disclosed herein. After transferring the entries 142A-N, the sequencer 122 may be configured to execute the entries 142A-N (and/or entry sequence 144) in response to memory commands and/or operations. Accordingly, the functionality of the sequencer 122 may be modified and/or expanded after design and/or fabrication of the NV memory 104 comprising the sequencer 122.

In some embodiments, the entries 142A-N (and/or entry sequence 144) may be generated on an external computing device, such as the host 103. The entries 142A-N (and/or entry sequence 144) may be generated by an application and/or process operating on the computing device, which may be embodied as instructions stored on a non-transitory computer-readable storage medium. Transferring the entries 142A-N and/or entry sequence 144 may comprise sending data and/or commands to the memory system 101 via the interconnect 101 (e.g., firmware update commands). Alternatively, or in addition, the entries 142A-N (and/or entry sequence 144) may be generated by one or more components of the memory system 101. In some embodiments, the sequencer adjustment module 177 comprises circuitry and/or logic configured for generating sequencer configuration data 140 from an MC timing specification as disclosed above. Generating the entries 142A-N may comprise sending commands and/or data comprising the MC timing specification to the sequencer adjustment module 177 via the interconnect 105. In response, the sequencer adjustment module 177 may generate the entry sequence 144, modify the sequencer configuration data 140 of the memory system 101, as disclosed above.

Figure 2:
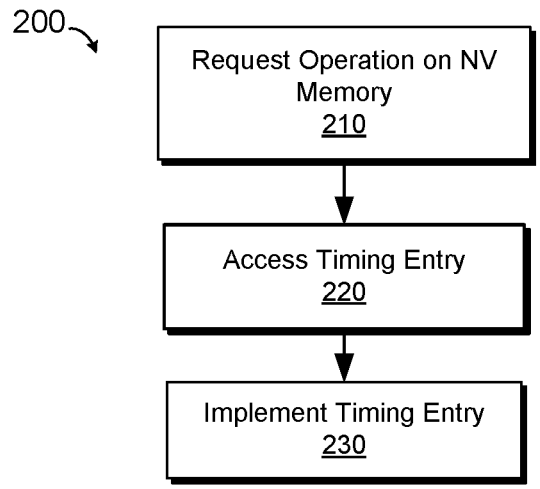
FIG. 2 is a flow diagram of one embodiment of a method for adapting the configuration, timing, and/or duration of memory command, timing, and/or control signals.

FIG. 2 is a flow diagram of one embodiment of a method 200 for using a random access memory to control memory operation pulses, as disclosed herein. Step 210 may comprise receiving a request to execute a particular operation on a NV memory 104 at control circuitry 120 of the NV memory 104. The control circuitry 120 may be embodied within a same NV memory structure 110 as the NV memory elements 112 of the NV memory 104 (e.g., may be disposed within the same die, substrate, package, chip, and/or the like).

Step 220 may comprise accessing a timing entry corresponding to the particular operation from the memory unit 129 (e.g., the volatile memory 124 and/or non-transitory storage 106). Step 220 may further comprise populating the volatile memory 124 with sequencer data 140 during initialization of the memory system 101, as disclosed herein (e.g., by transferring the sequencer data 140 from non-transitory storage 106 to the volatile memory 124).

Step 230 may comprise implementing the timing entry accessed at step 220. Step 230 may comprise generating one or more MC signal vectors 123 designated by signal data 143 of the timing entry. Step 230 may further comprise generating the MC signal vector 123 for a determined number of clock cycles. The number of clock cycles may be determined from timing data 145 of the timing entry. In some embodiments, the timing data 145 comprises a mantissa and exponent, and determining the number of clock cycles comprises multiplying the mantissa by the exponent (e.g., calculating $m \times B^e$, where m is the mantissa, e is the exponent, and B is a base quantity, such as 2). Step 230 may comprise generating on-die MC signals adapted to configure on-die control circuitry to implement at least a portion of the particular operation. Step 230 may comprise generating on-die MC signals to bias one or more word lines of a NAND string 50, couple the NAND string to a source line 64 (and/or drain), drive a voltage potential on the source line 64, sense a current and/or voltage on a bit line coupled of the NAND string 50, apply one or more program voltage pulses to NV memory cells of the NAND string 50 (e.g., across a NAND page 51), latch data sensed on the NAND string 50, and/or the like, as disclosed herein.

Step 230 may further comprise implementing a series of timing entries (e.g., implementing an MC sequence 126). Step 230 may comprise accessing a next timing entry within the memory unit 129 in response to completing implementation of the timing entry, determining whether the next timing entry indicates that the operation has been completed (e.g., comprises a NOOP entry 142, halt entry 142, idle entry 142, and/or the like), as disclosed herein.

Figure 3:
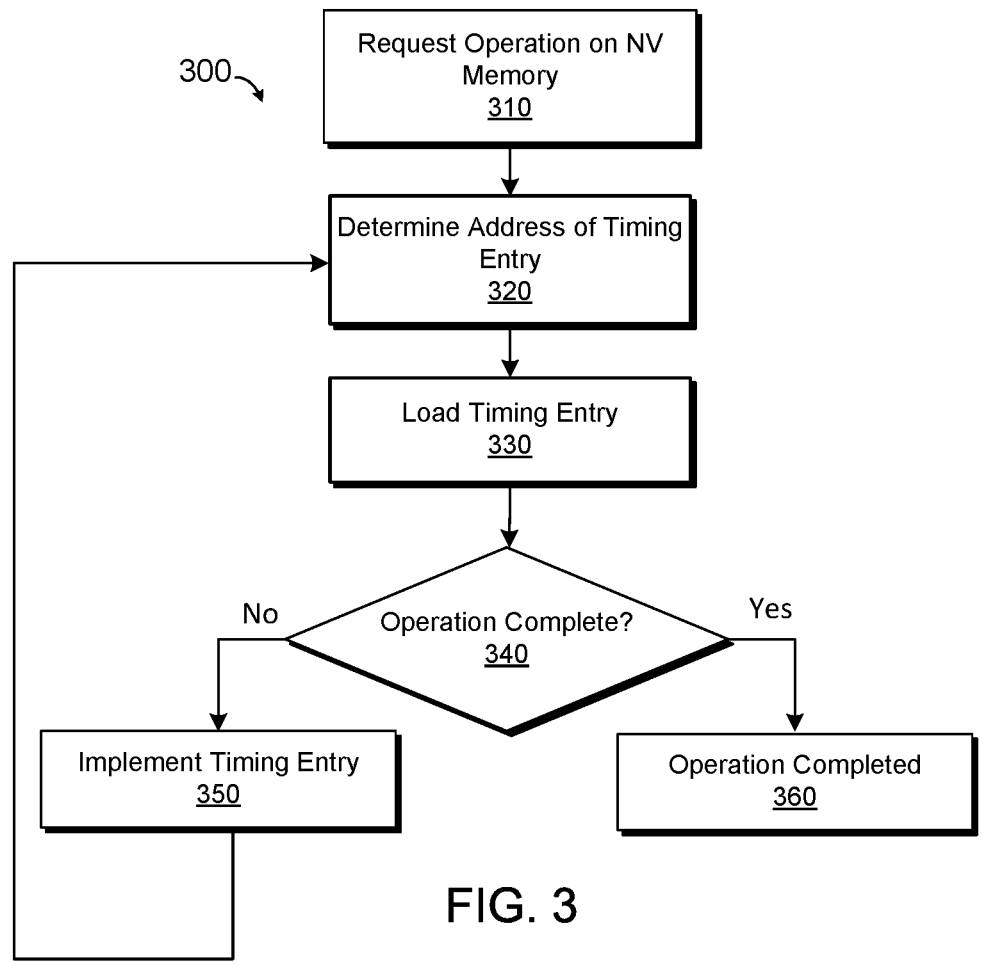
FIG. 3 is a flow diagram of another embodiment of a method for adapting the configuration, timing, and/or duration of memory command, timing, and/or control signals.

FIG. 3 is a flow diagram of another embodiment of a method 300 for using a random access memory to control memory operation pulses, as disclosed herein. Step 310 may comprise receiving a request to execute a particular operation on the NV memory 104 at the control circuitry 120 thereof.

Step 320 may comprise determining an address of a timing entry associated with the particular operation. In a first iteration, step 320 may comprise associating the particular operation (operation 118A-N) with a corresponding address 144A-N.

Figure 4:
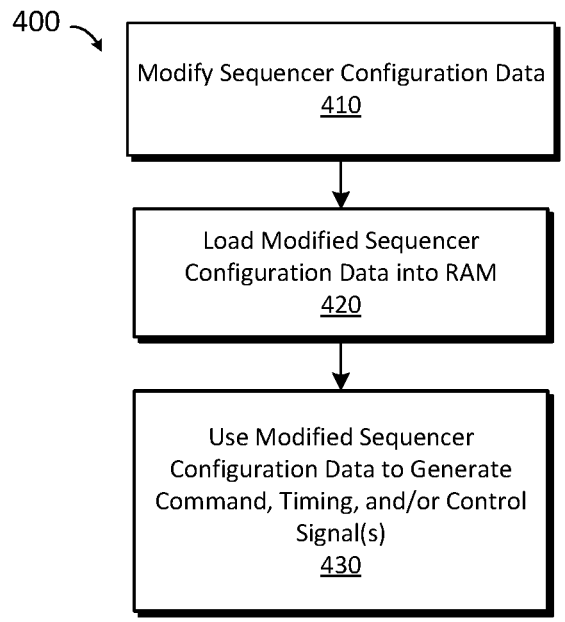
FIG. 4 is a flow diagram of one embodiment of a method for modifying the command, timing, and/or control signals generated by a sequencer of a memory system.

FIG. 4 is a flow diagram of one embodiment of a method 400 for modifying the configuration, timing, and/or duration of MC signal vector(s) 123 generated by the sequencer 122 during operation of the memory system 101 (e.g., after design and/or fabrication of the NV memory 104). Step 410 may comprise modifying the sequencer configuration data 140 of the memory system 101, which may comprise writing the modified sequencer configuration data 140 to the memory unit 129 (e.g., within one or more of the non-transitory storage 106 and/or volatile memory 124). Step 410 may be implemented in response to a usage conditions, wear levels, testing conditions, error rates, user preferences, commands, settings, parameters, and/or the like, as disclosed herein.

Step 420 may comprise loading the modified sequencer configuration data 140 into the volatile memory 124 communicatively coupled to the sequencer 122. Step 420 may further comprise populating the volatile memory 124 with sequence configuration data 140 maintained within the non-transitory storage 106 (e.g., during initialization of the memory system 101). The modified sequencer configuration data 140 may comprise one or more modified entries 142 (e.g., modified sequencer instructions). The modified sequencer entries 142 may alter the configuration, timing, and/or duration of one or more MC signal vector(s) 123 and/or MC sequencers 126 defined by existing entries 142 and/or entry sequences 144 of the sequencer configuration data 140. Step 420 may comprise overwriting and/or replacing the existing entries 142 and/or entry sequences 144 in the sequencer configuration 140. Alternatively, the modified sequencer configuration data 140 may define one or more new MC sequences 126, which may be added to the sequencer configuration data 140 (as opposed to overwriting and/or replacing existing configuration information). Step 420 may further comprise associating the new sequencer entries 142 and/or entry sequences 144 with one or more memory operations and/or commands, as disclosed herein (e.g., in associations 153). Step 420 may, therefore, comprise updating associations 153 defined in the sequencer configuration data 140 (e.g., as stored within one or more of the memory unit 129, non-transitory storage 106, volatile memory 124, sequencer 122, and/or the like).

Step 430 may comprise using the modified sequencer configuration data 140 to generate MC signal vector(s) 123 and/or MC sequences 126. Step 430 may comprise the sequencer 122 executing a memory operation within the NV memory 104. As disclosed herein, executing a memory operation may comprise: a) associating the memory operation with an entry 142 stored within the memory unit 129 (and/or a sequence of entries 142, such as an entry sequence 144), b) loading the entry 142 from the memory unit 129, and c) executing the entry 142. Executing the entry 142 may comprise asserting an MC signal vector 123 corresponding to signal data 143 of the entry 143 for a number of clock cycles specified by timing data 145 of the entry 142. Executing the entry 142 may further comprise fetching a next entry 142 from the memory unit 129 (e.g., volatile memory 124) and/or executing subsequent entries 142 stored within the memory unit 129 until the memory operation is complete, as disclosed herein. The entries 142 accessed and/or executed by the sequencer in step 430 may correspond to the modified sequencer configuration data 140, which may comprise modifications to the configuration, timing, and/or duration of the MC signal vectors 123 produced by the sequencer 122 in step 430 (as compared to MC signal vectors 123 corresponding to the original, unmodified sequencer configuration data 140).

Figure 5:
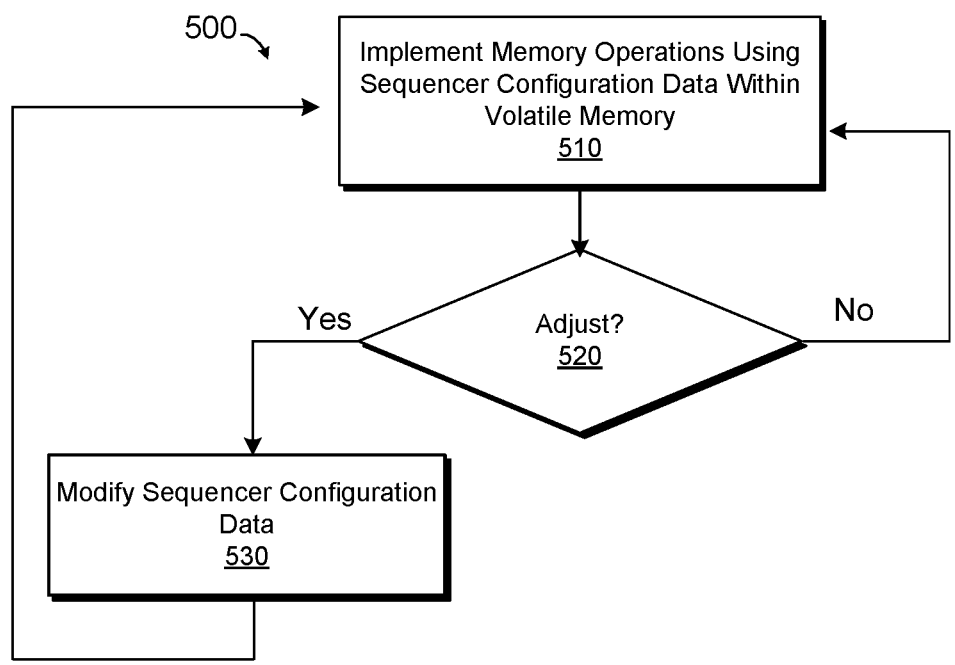
FIG. 5 is a flow diagram of another embodiment of a method for modifying the command, timing, and/or control signals generated by a sequencer of a memory system.

FIG. 5 is a flow diagram of another embodiment of a method 500 for modifying the configuration, timing, and/or duration of MC signal vector(s) 123 generated by the sequencer 122 during operation of the memory system 101 (e.g., after design and/or fabrication of the NV memory 104). Step 510 may comprise implementing memory operations using sequencer configuration data 140 stored within the memory unit 129 (e.g., non-transitory storage 106 and/or volatile memory 124), as disclosed herein.

Step 520 may comprise determining whether to adjust and/or modify the sequencer configuration data 140. The determination of step 520 may be based on one or more of: usage conditions, wear levels, testing conditions, error rates, user preferences, commands, settings, parameters, and/or the like, as disclosed herein. Step 520 may comprise monitoring memory operations being implemented within the NV memory 140 (and/or performing dedicated test operations within the NV memory 140). Step 520 may further comprise monitoring the NV memory 104 and/or respective physical zones 182A-D (e.g., monitoring error rates, wear levels, and/or the like). Step 520 may comprise determining to modify the sequencer configuration data 140 based on increased error rates (e.g., detecting increases in error rates that exceed one or more thresholds). Step 520 may further comprise determining to modify the sequencer configuration data 140 based on wear level(s) of the NV memory 104 exceeding one or more thresholds. Step 520 may comprise determining to modify the sequencer configuration data 140 in response to a command and/or request to modify the sequencer configuration data 140 received via the interconnect 105 and/or 107. Step 520 may comprise determining to modify the sequencer configuration data 140 pertaining to a particular physical zone 182 (e.g., in response to determining that the physical zone 182D has different characteristics from one or more other physical zones 182A-C). If the determination of step 520 is to adjust the sequencer configuration data 140, the flow may continue at step 530; otherwise, the flow may continue back at step 510 (where the sequencer 122 may continue implementing the original, unmodified sequencer configuration data 140 stored within the memory unit 129, e.g., volatile memory 124).

Step 530 may comprise adjusting the sequencer configuration data 140 to produce modified sequencer configuration data 140, as disclosed herein. Step 530 may comprise adjusting entries 142 and/or entry sequences 144 of the sequencer configuration data 140 to modify the configuration, timing, and/or duration of one or more MC signal vectors 123 generated by the sequencer 122 during operation of one or more memory commands. In some embodiments, the modifications may comprise relaxing timing margins of the memory operations (and/or portions thereof), which may comprise increasing the latency of such memory operations. Step 530 may further comprise adjusting the sequencer configuration data 140 pertaining to one or more physical zones 182A-D, as disclosed herein, which may comprise generating one or more alternative entries 142 and/or entry sequences 144 and/or associating memory commands pertaining to the or more physical zones 182A-D with the alternative entries 142 (while memory operations pertaining to other physical zones 182A-D remain unchanged).

Step 530 may further comprise recording the modified sequencer configuration data 140 within the memory unit 129 (e.g., the non-transitory storage 106 and/or volatile memory 124). Step 530 may comprise storing the modified sequencer configuration 140 within the non-transitory storage 106 of the memory unit 129. Step 530 may further comprise populating the volatile memory 124 with the modified sequencer configuration data 140 generated at step 530 (e.g., transferring the modified sequencer configuration data 140 from the non-volatile storage 106 to the volatile memory 124). The modified sequencer configuration data 140 may be transferred during initialization of the memory system 101. Alternatively, or in addition, the modified sequencer configuration data 140 may be transferred to the volatile memory 124 during operation of the memory system 101 (in response to modifying the sequencer configuration data 140 at step 520). Step 530 may comprise pausing execution of memory operations while the modified configuration data 140 is transferred to the volatile memory 140 Step 530 may further comprise allowing any memory operations that are in progress to complete before modifying the sequencer configuration data 140 stored in the volatile memory 124.

Following step 530, the flow may continue back at step 510, which may comprise the sequencer 122 using the sequencer configuration data 140 stored within the memory unit 129 (e.g., volatile memory 124) to implement memory operations, as disclosed herein. Step 510 may, therefore, comprise implementing the modified sequencer configuration data 140 populated within the memory unit 129 at step 530.

Figure 6:
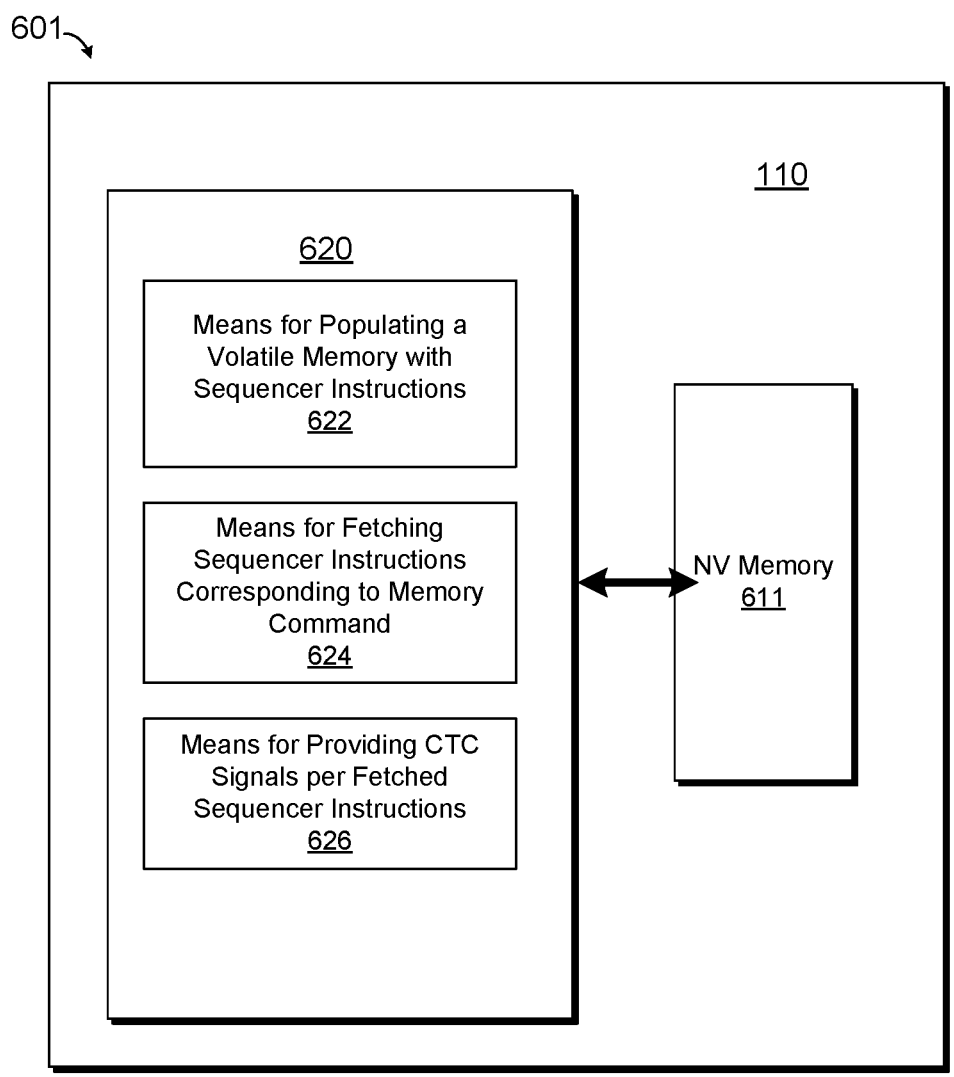
FIG. 6 is a schematic block diagram of one embodiment of a system for on-die control of command, timing, and/or control signals.

FIG. 6 is a schematic system diagram depicting one embodiment of a system for on-die control of MC signals 143. The system 601 may comprise control means 620. The control means 620 may be embodied on and/or within NV memory structure 110 comprising NV memory 611 (e.g., an NV memory core 111, NV memory array 171, and/or the like).

The control means 620 may be configured to implement memory operations within the NV memory 611. The control means 620 may comprise control circuitry 120, as disclosed herein. The control means 620 may comprise means for populating a volatile random access memory (RAM) with sequencer instructions 622 (e.g., sequencer configuration data 140 comprising a plurality of entries 142). Each sequencer entry may comprise respective timing data and/or signal data, as disclosed herein. The means 622 may comprise one or more of the system controller 102, non-transitory storage 106, control circuitry 120, sequencer 122, and/or memory unit 129, as disclosed herein.

The control means 620 may further comprise means for executing a memory command within the NV memory 611. The control means 620 may comprise means for fetching sequencer instructions corresponding to a memory command from the volatile RAM 624. The means 624 may comprise one or more of the control circuitry 120, sequencer 122, memory unit 129, memory bus 121, fetch unit 152, decode unit 154, execution unit 156, and/or driver circuitry 158, as disclosed herein. The control means 620 may further comprise means for providing MC signals in accordance with the fetched sequencer instructions 626. The means 626 may comprise one or more of the control circuitry 120, sequencer 122, memory unit 129, memory bus 121, fetch unit 152, decode unit 154, execution unit 156, and/or driver circuitry 158, as disclosed herein.

Aspects of this disclosure may be embodied as an apparatus, system, method, logic, programmable logic, circuit, and/or computer program product (e.g., instructions and/or code stored and/or embodied on a non-transitory computer-readable storage medium). Accordingly, aspects of this disclosure may take the form of hardware, software (including firmware, resident software, firmware micro-code, or the like), combinations of hardware and software, and/or the like. As such, aspects of this disclosure may be referred to herein as a "circuit," "module," "element," "apparatus," "system," and/or the like.

Many of the functional units described in this disclosure have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations, steps, and/or implementing aspects of this disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this disclosure to "one embodiment," "an embodiment," or similar language means that a particular feature, structure, or characteristic described in connection with the embodiment is included in at least one embodiment of the disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

We claim:

1. A die, comprising:
a non-volatile memory array; and
memory control circuitry configured to implement memory operations within the non-volatile memory array in response to control signals generated by a sequencer embodied on the die comprising the non-volatile memory array, the sequencer configured to:
retrieve sequencer entries corresponding to respective memory operations from a programmable memory unit, the retrieved sequencer entries comprising signal data and corresponding timing data, the signal data defining respective sets of control signals to be output for time periods specified by the corresponding timing data, and
generate control signals in accordance with the retrieved sequencer entries, comprising the sequencer generating the respective sets of control signals defined by the signal data of the retrieved sequencer entries, each set of control signals generated for a number of clock cycles specified by the corresponding timing data of the retrieved sequencer entries.

2. The die of claim 1, wherein in response to retrieving a particular sequencer entry from the programmable memory unit, the sequencer is configured to generate a set of control signals defined by the signal data of the particular sequencer entry for a number of clock cycles specified by the timer data of the particular sequencer entry.

3. The die of claim 1, wherein:
the timing data comprise an exponent and a mantissa; and
the sequencer is configured to determine a number of clock cycles specified by the timing data of a sequencer entry by use of the exponent and mantissa of the timing data of the sequencer entry.

4. The die of claim 3, wherein the sequencer is configured to calculate the number of clock cycles specified by the timing data of the sequencer entry as $m \times 2^e$, wherein m is the mantissa of the timing data and e is the exponent of the timing data.

5. The die of claim 1, wherein:
the sequencer is coupled to the programmable memory by a bus having a timing region and a signal region;
timing data of the sequencer entries are communicated via the timing region of the bus; and
signal data of the sequencer entries are communicated via the signal region of the bus.

6. The die of claim 1, wherein the programmable memory unit comprises one or more of: a volatile memory, a random access memory (RAM), a static random access memory (SRAM), a dynamic random access memory (DRAM), a read only memory, a persistent memory, a non-transitory storage medium, and a non-volatile storage medium.

7. The die of claim 1, wherein the sequencer comprises:
fetch circuitry configured to retrieve a first sequencer entry from the programmable memory unit; and
output circuitry configured to generate a set of control signals defined by signal data of the first sequencer entry for a number of clock cycles specified by timing data of the first sequencer entry;
wherein the fetch circuitry is further configured to retrieve a second sequencer entry that follows the first sequencer entry in a series of sequencer entries.

8. The die of claim 7, wherein the sequencer further comprises:
decode circuitry configured to parse sequencer entries retrieved by the fetch circuitry, the decode circuitry further configured to determine that processing of the series of sequencer entries is complete in response to parsing a last sequencer entry of the series retrieved by the fetch circuitry;
wherein completing the series of sequencer entries comprises generating a sequence of control signal vectors, each control signal vector being generated for a number of clock cycles specified by the timing data of a corresponding sequencer entry of the series.

9. The die of claim 1, wherein the sequencer comprises state machine circuitry, comprising:
state logic configured to maintain a sequencer state, the sequencer state defining an output state for the control signals;
output logic configured to output the control signals defined by the sequencer state maintained by the state logic; and
next state logic configured to determine a next sequencer state based on a sequencer entry stored within the programmable memory unit and to transition the state logic to the next sequencer state in response to the state logic maintaining the sequencer state for a determined number of clock cycles.

10. A system, comprising:
a programmable memory comprising sequencer instructions corresponding to respective memory operations, the sequencer instructions comprising sequencer timing entries comprising timer data and signal data, the signal data specifying memory control signals having cycle counts specified by the timer data;
a semiconductor structure comprising a plurality of non-volatile memory elements and control circuitry configured for implementing memory operations on selected non-volatile memory elements in response to memory control signals; and
a sequencer embodied within the control circuitry of the semiconductor structure and configured to execute sequencer instructions stored within the programmable memory, wherein, to execute a sequencer instruction pertaining to a memory operation, the sequencer is further configured to:
load the sequencer instruction from the programmable memory;
determine a cycle count from timer data of the loaded sequencer instruction; and
output memory control signals specified by signal data of the loaded sequencer instruction for the determined cycle count, the memory control signals output by the sequencer configured to cause the control circuitry to implement at least a portion of the memory operation on one or more of the non-volatile memory elements within the semiconductor structure.

11. The system of claim 10, wherein:
the timer data of the loaded sequencer instruction comprises an exponent value and a mantissa value; and
the sequencer is further configured to determine the cycle count by calculating $m \times B^e$, where m is the mantissa value, e is the exponent value, and B is a base quantity.

12. The system of claim 10, wherein the semiconductor structure comprises one or more of a semiconductor substrate, a semiconductor wafer, a semiconductor layer, a memory chip, a memory package, a memory die, a Flash memory die, a NAND-Flash die, and a NOR-Flash die.

13. The system of claim 10, further comprising:
a bus configured to communicatively couple the sequencer to the programmable memory, wherein:
a first section of the bus is designated for communication of timer data of respective sequencer instructions; and
a second section of the bus, different from the first section, is designated for communication of signal data of respective sequencer instructions.

14. The system of claim 10, further comprising:
a configuration manager configured to populate the programmable memory with the plurality of sequencer instructions from a non-volatile storage location.

15. The system of claim 14, wherein the configuration manager is further configured to write a modified sequencer instruction to one or more of the programmable memory and the non-volatile storage location in response to one or more of:
receiving the modified sequencer instruction; and
generating the modified sequencer instruction in response to one or more of: a wear level of the non-volatile memory elements and an error rate of the non-volatile memory elements.

16. The system of claim 10, wherein the sequencer is further configured to:
load the sequencer instruction from a determined sequencer instruction address; and
determine the sequencer instruction address based on one or more of: an opcode of the memory operation and an address of the non-volatile memory element of the memory operation within the semiconductor structure.

17. The system of claim 16, wherein the sequencer is further configured to:
execute a series of sequencer instructions from a first sequencer instruction at the determined sequencer instruction address to a last sequencer instruction; and
identify the last sequencer instruction of the series based on one or more of timing data of the last sequencer instruction and signal data of the last sequencer instruction.

18. The system of claim 10, wherein:
a first sequencer instruction stored within the programmable memory comprises first timing parameters for memory control signals pertaining to one or more of a read operation, a write operation, and an erase operation on non-volatile memory elements of the semiconductor structure; and the system further comprises a sequencer adjustment module configured to:
  determine modified timing parameters for the memory control signals of the first sequencer instruction; and
  update the first sequencer instruction to replace the first timing parameters with the modified timing parameters;
  wherein updating the first sequencer instruction comprises one or more of: overwriting at least a portion of the first sequencer instruction stored within the programmable memory, and overwriting at least a portion of the first sequencer instruction stored within non-volatile firmware storage for the control circuitry.

19. A method, comprising:
storing configuration data comprising a plurality of sequencer vectors within a volatile random access memory (RAM) communicatively coupled to a sequencer circuit embodied within a non-volatile (NV) circuit structure; and
implementing a series of sequencer vectors stored within the volatile RAM at the sequencer circuit in response to a request to implement an operation on NV memory cells of the NV circuit structure, comprising:
  transferring a data unit comprising a first sequencer vector of the series from the volatile RAM; and
  interpreting the bit values of the data unit according to a determined layout for the sequencer vectors stored within the volatile RAM, wherein first bit values comprise an output signal vector, second bit values comprise a mantissa, and third bit values comprise an exponent;
  executing the first sequencer vector, comprising:
    producing on-die memory control signals corresponding to the output signal vector of the first sequencer vector for a determined number of clock cycles, the on-die memory control signals configured to cause one or more functional modules of the control circuitry to implement at least a portion of the memory operation, wherein the determined number of clock cycles is calculated as $m \times 2^e$, where m is the mantissa and e is the exponent of the first sequencer vector; and
    processing a next sequencer vector in the series in response to completing execution of the first sequencer vector.

20. The method of claim 19, wherein the on-die memory control signals are configured to control operation of one or more of:
  charge pump circuitry configured to generate designated voltage potentials on selected word lines of the NV memory array;
  driver circuitry configured to generate designated voltage potentials on selected bit lines of the NV memory array;
  pulse generation circuitry configured to apply programming voltage pulses to selected NV memory cells of the NV memory array; and
  sense circuitry configured to sense selected bit lines of the NV memory array.

21. The method of claim 19, further comprising:
determining an address for the data unit comprising the first sequencer vector of the series based on associations between memory operations and respective data unit addresses;
transferring the data unit comprising the first sequencer from the determined data unit address; and
reading a data unit comprising the next sequencer vector in the series from a next data unit address following the determined data unit address.

22. The method of claim 21, further comprising:
loading the configuration data comprising the sequencer vectors into the volatile RAM from non-volatile storage location during an initialization operation;
receiving a modified sequencer vector; and
writing the modified sequencer vector to one or more of the volatile memory and the non-volatile storage location;
wherein writing the modified sequencer vector comprises one or more of:
  replacing the first sequencer vector with the modified sequencer vector in the configuration data; and
  adding the modified sequencer vector to the configuration data.

23. A system, comprising:
means for storing a plurality of sequencer timing vectors in a volatile random access memory (RAM) at respective addresses, each sequencer timing vector having a respective timing and control signal data;
means for executing a memory command on a non-volatile memory, wherein the means for executing are embodied within a memory structure comprising non-volatile memory cells of the non-volatile memory, wherein executing the memory command comprises:
  associating the memory command with an address of the volatile RAM;
  fetching a sequencer timing vector from the address associated with the memory command; and
  implementing the sequencer timing vector, the implementing comprising:
    determining a timing parameter for the sequencer timing vector by use of a mantissa and exponent included in the timing data of the sequencer timing vector, and
    providing control timing signals corresponding to the control signal data of the sequencer timing vector to command execution circuitry in accordance with the determined timing parameter, the control timing signals configured to cause the command execution circuitry to execute at least a portion of the memory command on one or more non-volatile memory cells of the non-volatile memory;
means for fetching a next sequencer timing vector from a next address of the volatile RAM;
means for determining whether execution of the memory command on the non-volatile memory is complete based on one or more of timing data of the next sequencer timing vector and control signal data of the next sequencer timing vector; and
means for implementing the next sequencer timing vector in response to determining that execution of the memory command on the non-volatile memory is not complete.

* * * * *